(12) United States Patent
Riedel et al.

(10) Patent No.: US 7,249,341 B2
(45) Date of Patent: Jul. 24, 2007

(54) SYNTHESIS OF CYCLIC COMBINATIONAL CIRCUITS

(75) Inventors: Marcus D. Riedel, Pasadena, CA (US); Jehoshua Bruck, La Canada, CA (US)

(73) Assignee: California Institute of Technology, Pasadena, CA (US)

(*) Notice: Subject to any disclaimer, the term of this patent is extended or adjusted under 35 U.S.C. 154(b) by 331 days.

(21) Appl. No.: 10/728,570

(22) Filed: Dec. 5, 2003

(65) Prior Publication Data
US 2004/0139416 A1    Jul. 15, 2004

Related U.S. Application Data

(60) Provisional application No. 60/520,493, filed on Nov. 14, 2003, provisional application No. 60/431,167, filed on Dec. 5, 2002.

(51) Int. Cl.
*G06F 17/50* (2006.01)
(52) U.S. Cl. ............................................. 716/18; 716/1
(58) Field of Classification Search .................. 716/18, 716/1
See application file for complete search history.

(56) References Cited

U.S. PATENT DOCUMENTS

| 5,515,292 | A | * | 5/1996 | Roy et al. ........................ 716/2 |
| 6,105,139 | A | | 8/2000 | Dey et al. |
| 6,430,726 | B1 | | 8/2002 | Nakamura |
| 6,591,231 | B1 | | 7/2003 | Kurshan et al. |

OTHER PUBLICATIONS

International Search Report for International PCT Application PCT/US03/38622 dated May 4, 2004.
Robert Allen Short, "A Theory of Relations Between Sequential and Combinational Realizations of Switching Functions", Feb. 1961, pp. 1-115.
William H. Kautz, "The Necessity of Closed Circuit Loops in Minimal Combinational Circuits", IEEE Transactions on Computers, Feb. 1970, pp. 162-164.
David A. Huffman, "Combinational Circuits with Feedback", pp. 27-55.
Ronald L. Rivest, "The Necessity of Feedback in Minimal Monotone Combinational Circuits", IEEE Transactions on Compubers, Jun. 1977, pp. 606-607.
Leon Stok, "False Loops through Resource Sharing", IEEE, 1992, pp. 345-348.
Sharad Malik, "Analysis of Cyclic Combinational Circuits", IEEE Transactions on Computer-Aided Design of Integrated Circuits and Systems, vol. 13, No. 7, Jul. 1994, pp. 950-995.
Anand Raghunathan et al., "Test Generation for Cyclic Combinational Circuits", IEEE Transactions on Computer-Aided Design of Intergrated Circuits and Systems, vol. 14, No. 11.

(Continued)

*Primary Examiner*—Sun James Lin
(74) *Attorney, Agent, or Firm*—Townsend and Townsend and Crew

(57) ABSTRACT

A method for the synthesis of multi-level combinational circuits with cyclic topologies. The techniques, applicable in logic synthesis, and in particular in the structuring phase of logic synthesis, optimize a multi-level description, introducing feedback and potentially optimizing the network.

69 Claims, 26 Drawing Sheets

$$a = \overline{x}_0 \overline{x}_3 \overline{c} + \overline{x}_1 c$$

$$b = \overline{x}_0 (\overline{x}_1 \overline{x}_2 + x_1 \overline{x}_3)$$

$$c = x_0 x_2 \overline{x}_3 + \overline{x}_2 (\overline{x}_1 x_3 + e)$$

$$d = x_1 \overline{x}_2 \overline{x}_3 + a(x_2 + x_3)$$

$$e = x_0 \overline{x}_3 d + b$$

$$f = \overline{x}_2 c + \overline{x}_3 \overline{e}$$

$$g = x_0 \overline{x}_3 + a$$

OTHER PUBLICATIONS

Arvind Srinivasan et al., "Practical Analysis of Cyclic Combinational Circuits", IEEE Custom Integrated Circuits Conference, 1996, pp. 381-384.

Thomas Robert Shiple et al., "Formal Analysis of Synchronous Circuits", pp. 1-202.

Thomas R. Shiple et al., "Analysis of Combinational Cycles in Sequential Circuits", IEEE International Symposium on Circuits and Systems, vol. 4, 1996, pp. 592-595.

Thomas R. Shiple et al., "Constructive Analysis of Cyclic Circuits", Paris, Mar. 1996, pp. 1-6.

Robert de Simone, "Note: A Small Hardware Bus Arbiter Specification Leading Naturally to Correct Cyclec Description", Mar. 1996, pp. 1-8.

Amar Bouali et al., "Verifying Synchronous Reactive Systems Programmed in ESTEREL", pp. 1-4.

Stephen A. Edwards, "Making Cyclic Circuits Acyclic", pp. 159-162.

R. K. Brayton et al., "Multilevel Log Synthesis", Proceedings of the IEEE, vol. 78, No. 2, Feb. 1990, pp. 264-300.

Randal E. Bryant, "Boolean Analysis of MOS Circuits", IEEE Trans. Computer-Aided Design, Feb. 1987, pp. 1-32.

R. Brayton et al., Logic Minimization Algorithms for VLSI Synthesis, Chapter 7, "Comparisons and Conclusions", pp. 160-173, 1984.

J. Brzozowski et al., Asynchronous Circuits, Chapter 6, "Up-Bounded-Delay Race Models", pp. 83-111, 1994.

J. Brzozowski et al., Asynchronous Circuits, Chapter 15, "Design of Asynchronous Circuits", pp. 314-367, 1994.

\* cited by examiner

| Inputs | | | | Outputs (corresponding to segments) | | | | | | | |
|---|---|---|---|---|---|---|---|---|---|---|---|
| $x_3$ | $x_2$ | $x_1$ | $x_0$ | $a$ | $b$ | $c$ | $d$ | $e$ | $f$ | $g$ | display |
| 0 | 0 | 0 | 0 | 1 | 1 | 1 | 1 | 1 | 1 | 0 | 0 |
| 0 | 0 | 0 | 1 | 0 | 1 | 1 | 0 | 0 | 0 | 0 | 1 |
| 0 | 0 | 1 | 0 | 1 | 1 | 0 | 1 | 1 | 0 | 1 | 2 |
| 0 | 0 | 1 | 1 | 1 | 1 | 1 | 1 | 0 | 0 | 1 | 3 |
| 0 | 1 | 0 | 0 | 0 | 1 | 1 | 0 | 0 | 1 | 1 | 4 |
| 0 | 1 | 0 | 1 | 1 | 0 | 1 | 1 | 0 | 1 | 1 | 5 |
| 0 | 1 | 1 | 0 | 1 | 0 | 1 | 1 | 1 | 1 | 1 | 6 |
| 0 | 1 | 1 | 1 | 1 | 1 | 1 | 0 | 0 | 0 | 0 | 7 |
| 1 | 0 | 0 | 0 | 1 | 1 | 1 | 1 | 1 | 1 | 1 | 8 |
| 1 | 0 | 0 | 1 | 1 | 1 | 1 | 1 | 0 | 1 | 1 | 9 |

$$a = \overline{x}_0\overline{x}_3\overline{c} + \overline{x}_1 c$$
$$b = \overline{x}_0(\overline{x}_1\overline{x}_2 + x_1\overline{x}_3)$$
$$c = x_0 x_2 \overline{x}_3 + \overline{x}_2(\overline{x}_1 x_3 + e)$$
$$d = x_1 \overline{x}_2 \overline{x}_3 + a(x_2 + x_3)$$
$$e = x_0 \overline{x}_3 d + b$$
$$f = \overline{x}_2 c + \overline{x}_3 \overline{e}$$
$$g = x_0 \overline{x}_3 + a$$

$$a = c = 0$$
$$b = 0$$
$$c = e = 0$$
$$d = 0 = 0$$
$$e = b + d = 0$$
$$f = \bar{e} + c = 1$$
$$g = 1$$

$$f_1 = \bar{x}_2 x_3 + \bar{f}_2 f_3$$
$$f_2 = \bar{x}_1 \bar{x}_2 \bar{x}_3 + x_1 \bar{f}_3$$
$$f_3 = \bar{x}_3 (\bar{x}_1 + \bar{x}_2) + \bar{x}_1 \bar{x}_2$$

$$f_1 = \bar{x}_2 x_3 + \bar{f}_2 f_3$$
$$f_2 = x_1 \bar{f}_3 + \bar{x}_3 \bar{f}_1$$
$$f_3 = f_1 \bar{f}_2 + \bar{x}_2 \bar{x}_3$$

| $f_1$ | | $f_1$ | | $f_1$ | |
|---|---|---|---|---|---|
| $\{f_2, f_3\}$ : | $g_1^{(1)}$ | $\{f_2, f_3\}$ : | $g_1^{(1)}$ | $\{f_2, f_3\}$ : | $g_1^{(1)}$ |
| $\{f_2\}$ : | $g_1^{(2)}$ | $\{f_2\}$ : | $g_1^{(2)}$ | $\{f_2\}$ : | $g_1^{(2)}$ |
| $\{f_3\}$ : | $g_1^{(3)}$ | $\{f_3\}$ : | $g_1^{(3)}$ | $\{f_3\}$ : | $g_1^{(3)}$ |
| 0 : | $f_1$ | 0 : | $f_1$ | 0 : | $f_1$ |

FIGURE 13

$$f_1 = \bar{x}_3 \bar{f}_2 + \bar{x}_2 x_3$$

$$f_2 = \bar{x}_1 \bar{x}_2 \bar{x}_3 + \bar{x}_1 \bar{f}_3$$

$$f_3 = \bar{x}_1 f_1 + \bar{x}_2 x_3$$

SYNTHESIS OF CYCLIC COMBINATIONAL CIRCUITS

REFERENCE TO PRIORITY DOCUMENT

This application claims the benefit of priority of now abandoned U.S. Provisional Patent Application Ser. No. 60/431,167 entitled "A Method and Computer Program for the Design of Combinational Circuits with Cycles" filed Dec. 5, 2002 and claims the benefit of priority of co-pending U.S. Provisional Patent Application Ser. No. 60/520,493 entitled "Combinational Circuits with Feedback" filed Nov. 14, 2003. Priority of the respective filing dates of Dec. 5, 2002 and Nov. 14, 2003 are hereby claimed, and the disclosures of the Provisional Patent Applications are hereby incorporated by reference.

BACKGROUND

1. Field of the Invention

The invention relates generally to logic synthesis, and more particularly, to the synthesis of combinational circuits with cycles.

2. Description of the Related Art

Increased complexity in digital logic circuits make the use of logic synthesis essential for all but the simplest designs. Conventional logic circuits are made up of combinational and sequential circuits. A type of logic circuit, referred to as a combinational circuit, has outputs that depend only on the current values of the circuit's inputs. Because their outputs depend only on the current values of their inputs, combinational circuits are referred to as being "memoryless". Another type of logic circuit, referred to as a sequential circuit, has outputs that may depend upon past as well as current values of the circuit's inputs, in other words a sequential circuits has "memory". Combinational circuits are generally thought of as acyclic, that is as feed-forward or loop-free, structures while sequential circuits are thought of as cyclic structures that include loops. In fact, "combinational" and "sequential" are often defined in this way.

In a conventional logic synthesis system, a front-end process accepts a high level description of the design, such as a hardware description language (HDL) design that typically specifies input variables, internal variables, and output variables, and converts the high level description into a set of boolean equations that describe the system. The logic synthesis system, or tool, then optimizes a multilevel network description of the design that generally includes both combinational and sequential circuits. The optimization procedures generally are applied to produce smaller, faster representations of the design. A back-end process produces a final circuit design based on the technology of the target device in which the design will be implemented.

As designs become larger and more complex, synthesis tools need to design circuits that are optimized according to a number of possible criteria. Minimization of the area that a circuit occupies on a target device allows for more complex designs to be implemented on a device of a given size. Also, reducing the area required to implement an existing design may allow it to be implemented on a smaller target device. Minimizing the delay of a circuit allows for a higher clock speed, resulting in a faster, more efficient circuit. Other optimization criteria can include reducing power consumption, increased fault tolerance, and increased testability.

Therefore, there is a need for an improved method and apparatus for synthesis of circuits.

SUMMARY

A combinational circuit is produced by determining cyclic parameters and by synthesizing a combinational circuit in accordance with the determined cyclic parameters. This improves the efficiency for designing, synthesizing, and implementing cyclic combinational circuits.

If desired, the cyclic parameters can be determined by defining input variables, defining output variables, and then defining a set of relationships between the input and output variables, whereby the set of relationships include cycles. This can efficiently specify cyclic combinational circuits.

Other features and advantages of the present invention should be apparent from the following description of the preferred embodiment, which illustrates, by way of example, the principles of the invention.

BRIEF DESCRIPTION OF THE DRAWINGS

FIG. 13 is a table illustrating a relation of nodes in a three node network

DETAILED DESCRIPTION

Combinational circuits are generally thought of as acyclic structures and sequential circuits as cyclic structures. A collection of logic gates connected in an acyclic, or loop-free, topology is combinational because, regardless of the initial values of its inputs, once the inputs are fixed the signals propagate to the outputs. There is a direct correspondence between the electrical behavior of the circuit and the abstract notion of the boolean functions that it implements. The behavior of a circuit with feedback, or cycles, is generally more complicated. Such a circuit may exhibit sequential behavior, such as an R-S Latch, or it may be unstable, such as an oscillator.

Figure 1:
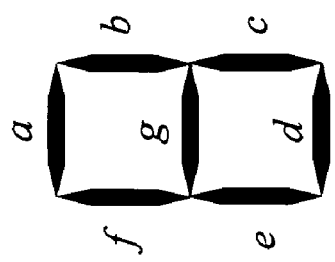
FIG. 1 is a diagram illustrating a truth table of a standard 7-segment display decoder.

Yet, cyclic circuits can be combinational. For example, FIG. 1 illustrates a truth table of a standard 7-segment display decoder. The decoder has four input signals $x_0$, $x_1$, $x_2$, and $X_3$ that are used to specify a number between 0 and 9. The display also has seven output signals a, b, c, d, e, f, and g that specify which segments to illuminate in an LED display. The output signals, expressed as acyclic functions of the input signals, for this circuit are:

$$a = \bar{x}_0 x_1 \bar{x}_3 + \bar{x}_2 (\bar{x}_1 (\bar{x}_3 + x_0) + \bar{x}_0 x_1)$$

$$b = \bar{x}_3 (\bar{x}_1 \bar{x}_2 + \bar{x}_0 x_2)$$

$$c = x_0 \bar{x}_1 \bar{x}_2 + \bar{x}_0 (x_3 (x_2 + x_1) + \bar{x}_1 \bar{x}_3)$$

$$d = x_0 \bar{x}_1 \bar{x}_2 + \bar{x}_0 (x_1 (\bar{x}_3 + \bar{x}_2) + \bar{x}_1 \bar{x}_2)$$

$$e = \bar{x}_1 \bar{x}_2 \bar{x}_3 + \bar{x}_0 (x_1 \bar{x}_2 x_3 + x_2 (\bar{x}_3 + \bar{x}_1))$$

$$f = \bar{x}_0 (\bar{x}_2 \bar{x}_3 + x_2 x_3 + \bar{x}_1) + \bar{x}_1 \bar{x}_2$$

$$g = \bar{x}_0 (x_3 + x_1) + \bar{x}_1 \bar{x}_2$$

The area required to implement a design, or a network, on a target device is correlated to the cost of the network. A typical technique used to estimate the cost of a network is to count the number of literals in the expressions of the functions. In the previous example of implementing the standard 7-segment display as acyclic functions, the cost is 55.

Figure 2:
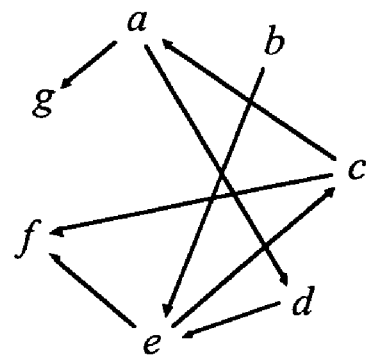
FIG. 2 is a network node diagram illustrating a network of the 7-segment display decoder that includes cycles in accordance with the invention.

FIG. 2 illustrates a network of the 7-segment display decoder that includes cycles in accordance with the invention. The output signals expressed as cyclic functions of the input signals for this circuit are:

$$a = \bar{x}_0 \bar{x}_3 c + \bar{x}_1 c$$

$$b = \bar{x}_0 (\bar{x}_1 \bar{x}_2 + x_1 \bar{x}_3)$$

$$c = x_0 x_2 \bar{x}_3 + \bar{x}_2 (\bar{x}_1 x_3 + e)$$

$$d = x_1 \bar{x}_2 \bar{x}_3 + a(x_2 + x_3)$$

$$e = x_0 \bar{x}_3 d + b$$

$$f = \bar{x}_2 c + \bar{x}_3 e$$

$$g = x_0 \bar{x}_3 + a$$

Referring to FIG. 2, it is noted that there is a cycle through nodes a, d, e, and c. Nevertheless, the circuit is combinational. There is feedback in a topological sense but not in an electrical sense.

Figure 3:
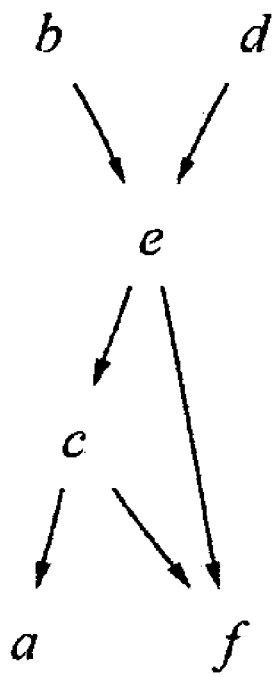
FIG. 3 is another network node diagram a network of the 7-segment display decoder.

That the circuit is combinational can be illustrated by considering specific input values. For example, FIG. 3 illustrates the network when $x_3=0$, $x_2=0$, $x_1=0$, and $x_0=0$, corresponding to the digit 1 on the 7-segment display. As shown in FIG. 3, with this set of inputs the network has no cycles and is combinational.

Figure 4:
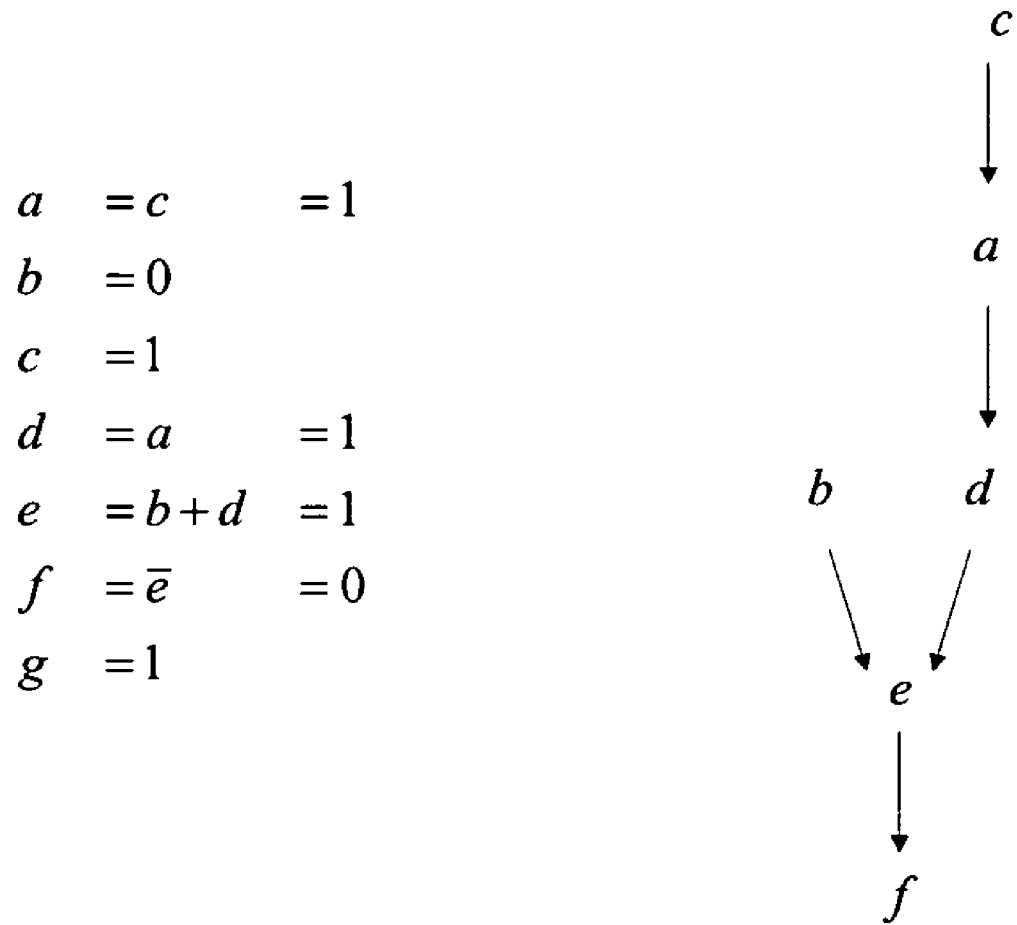
FIG. 4 is yet another network node diagram a network of the 7-segment display decoder.

FIG. 4 illustrates the network of FIG. 2 for another set of input signals. When the input signals are $x_3=0$, $x_2=10$, $x_1=0$, and $x_0=1$, corresponding to the digit 5 on th 7-segment display, the network simplifies to that shown in FIG. 4. As shown in FIG. 4, with this set of inputs the network again has no cycles and is combinational. In a similar manner all possible combinations of input signals can be shown to result in networks having no cycles and that are therefore combinational circuits.

An advantage to implementing a cyclic combinational circuit over an acyclic circuit is that the cost of the cyclic combinational circuit will usually be less than the corresponding acyclic circuit. For example, the cost of the cyclic combinational network illustrated in FIG. 2, expressed by counting the number of literals in the corresponding expression describing the 7-segment display, is 34 compared to a cost of 55 for the corresponding acyclic circuit. For additional comparison the Berkeley SIS package implemented an acyclic network for the 7-segment display with a cost of 37 when using the command "full_simplify" compared to the cyclic combinational circuit cost of 34. See E. Sentovich, et. al., SIS: A System For Sequential Circuit Synthesis, Tech. Rep., UCB/ERL M92/41, Electronics Research Lab, University of California, Berkeley, 1992; and Brayton et. al., "Multi-level Logic Synthesis", Proceedings of the IEEE, Vol. 78, No. 2, pp 264-300, 1990.

Figure 5:
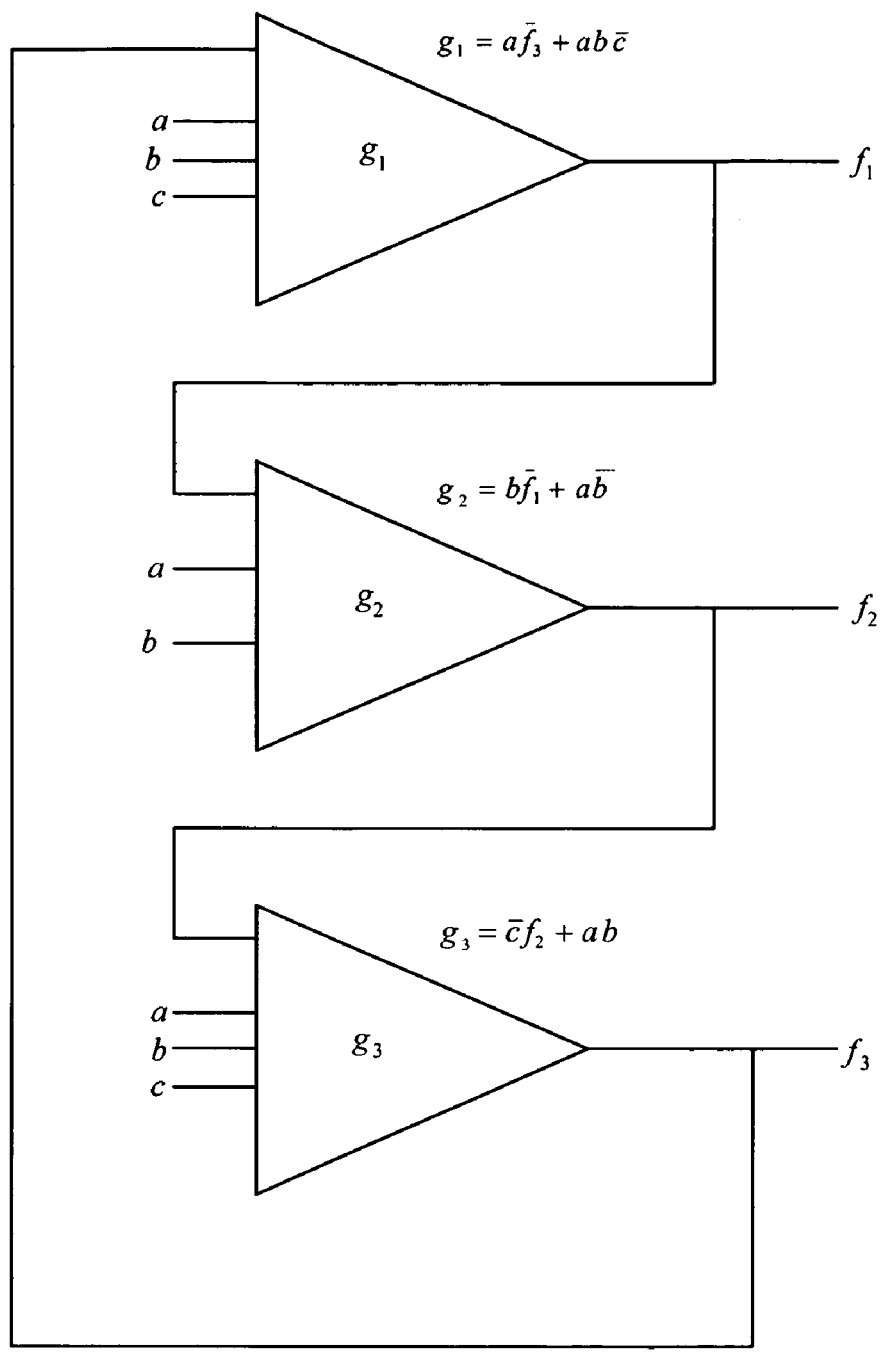
FIG. 5 is a circuit diagram of an example illustrating advantages of cyclic combinational networks.

Another example illustrating advantages of cyclic combinational networks is shown in FIG. 5. The network illustrated in FIG. 5 has three nodes, $g_1$, $g_2$ and $g_3$, producing output functions $f_1$, $f_2$ and $f_3$, respectively. Note that there is a cycle, $g_1$ receives $f_3$ as an input, $g_2$ receives $f_1$ as an input, and $g_3$ receives $f_2$ as an input. Nevertheless the circuit is combinational. For example, note that if a=0, then $g_1$ does not depend on $f_3$; if b=0 then $g_2$ does not depend on $f_1$; if a=1 and b=1, then $g_3$ do not depend on $f_2$. The circuit implements the functions $$f_1(a,b,c) = a\bar{b}c + ab\bar{c},$$

$$f_2(a,b,c) = \bar{a}b + a\bar{b} + bc,$$

$$f_3(a,b,c) = ab + a\bar{c} + b\bar{c}.$$

Figure 23:
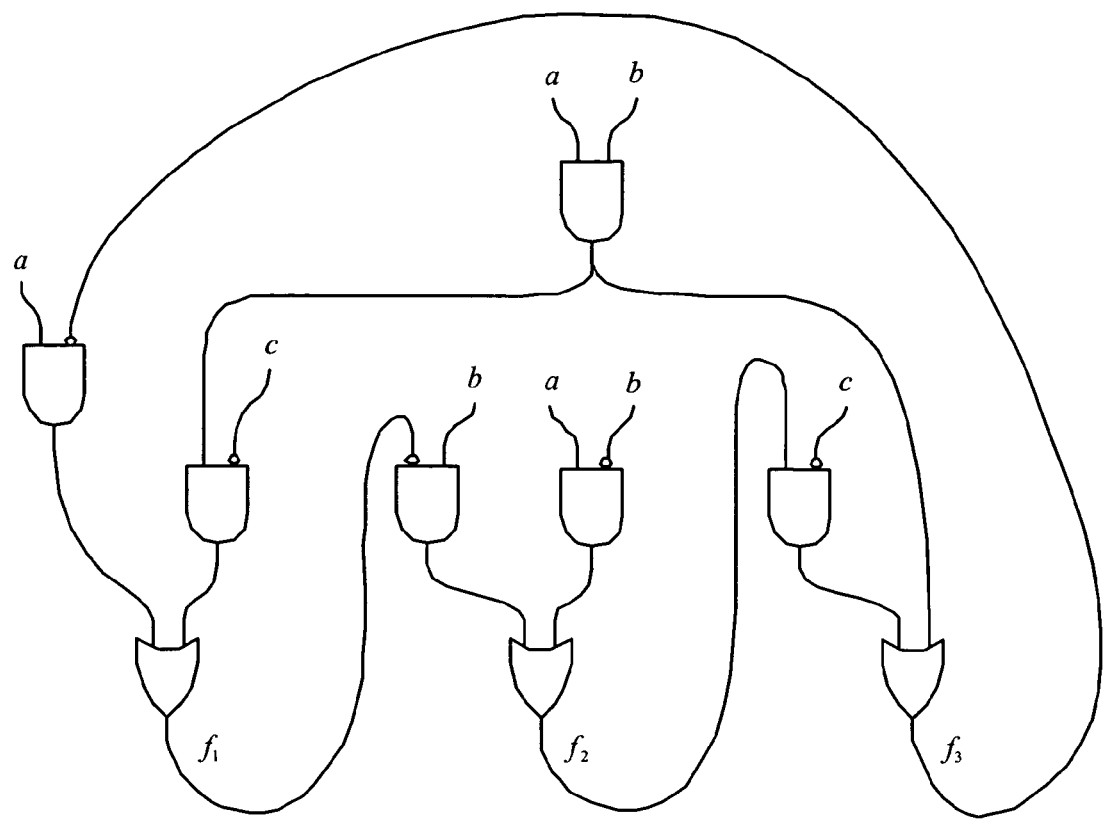
FIG. 23 is a block diagram illustrating an example of a circuit of the network of FIG. 5.

This network can be mapped to a circuit consisting of 9 fan-in two gates, as shown in FIG. 23.

Figure 6:
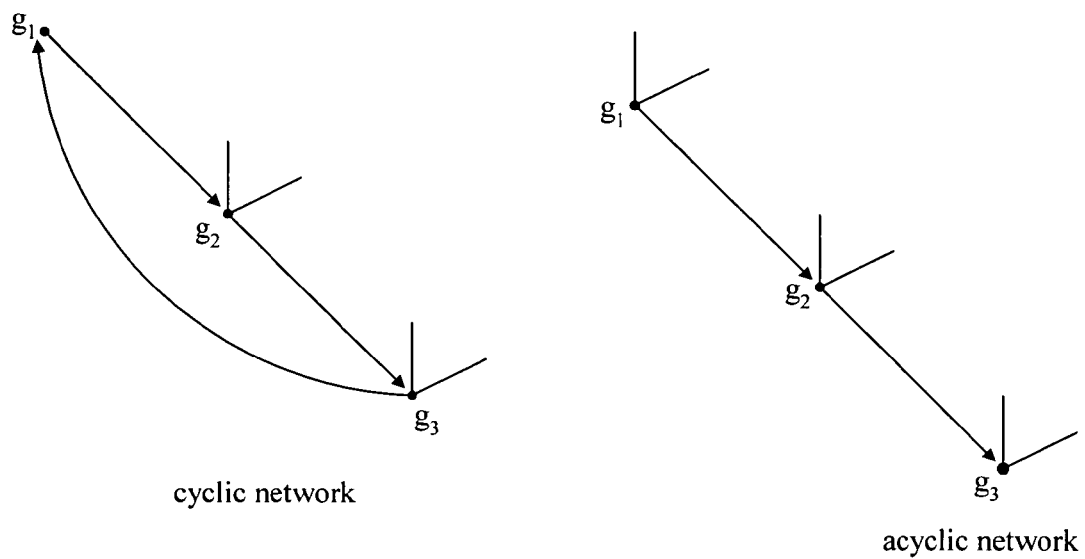
FIG. 6 is a network node diagram illustrating cyclic and acyclic networks.

As shown by these examples, introducing loops, or cycles, in the design of combinational circuits is advantageous. The intuition behind this is that with feedback, all nodes can potentially benefit from work done elsewhere; without feedback, nodes at the top of the hierarchy must be constructed from scratch. FIG. 6 is a diagram illustrating differences between cyclic and acyclic structures, that is without input from other nodes within the network. In the cyclic network 602, $g_1$ depends on $g_3$, $g_2$ depends on $g_1$, and $g_3$ depends on $g_2$. In the acyclic network 604, $g_1$ does not depend upon the other nodes. In this example, because $g_1$ does not depend upon the other nodes in the acyclic network 604 it generally requires additional gates to implement the acyclic network 604 over the number of gates required to implement the cyclic network 602 where $g_i$ does depend upon the other nodes in the network.

Chronology of Cyclic Combinational Circuits

As early as 1960, it was recognized that permitting cyclic topologies could reduce the size of relay networks. See R. A. Short, "A Theory of Relations Between Sequential and Combinational Realizations of Switching Functions," Stanford Electronics Laboratories, Technical Report 098-1, 1960, pp. 33-34, 102-114. Then, around 1970, it was argued that cyclic combinational circuits could have fewer logic gates than acyclic forms. See D. A. Huffman, "Combinational circuits with feedback," Recent Developments in Switching Theory, A. Mukhopadhyay, pp. 27-55, 1971; and W. H. Kautz, "The Necessity of Closed Circuit Loops in Minimal Combinational Circuits," IEEE Trans. Comp., Vol. C-19, pp. 162-166, 1970. Unfortunately, the examples given, although plausible, did not meet the rigorous condition for stability and uniqueness. It has been demonstrated that the example given by Kautz fails the test, and may not work correctly. See T. R. Shiple, "Formal Analysis of Synchronous Circuits," Ph.D. Thesis, University of California, Berkeley, 1996. Similar arguments have been made for the example given by Huffman.

Figure 7:
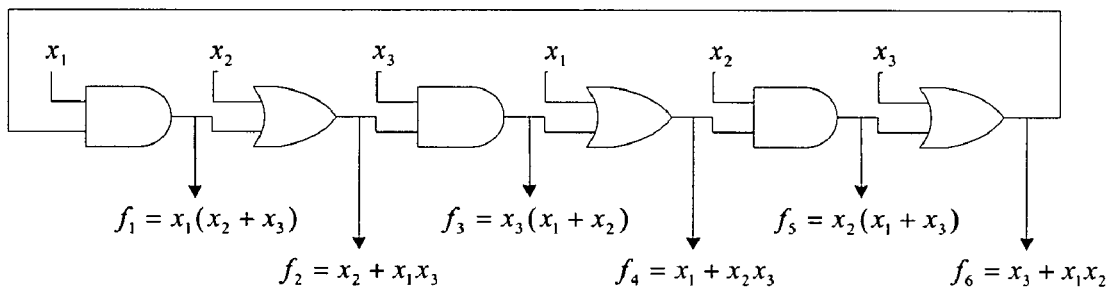
FIG. 7 is a circuit diagram of a cyclic combinational circuit.

In 1977 a convincing example of a family of cyclic combinational circuits was presented. See R. L. Rivest, "The Necessity of Feedback in Minimal Monotone Combinational Circuits," IEEE Trans. Comp., Vol. C-26, No. 6, pp. 606-607, 1977. The example family of cyclic combinational circuits presented consisted of a circuit of n AND gates, where n is an odd integer greater than 1, alternating with n OR gates in a single cycle, with n inputs repeated twice. An example circuit of this type, for n=3, is shown in FIG. 7. It has been shown that the circuit illustrated in FIG. 7 is combinational and each gate computes a distinct output function depending on all n variables. Significantly, it has also been proven that the circuit of FIG. 7 is optimal in terms of the number of fan-in two gates used. The cyclic circuit shown in FIG. 7 is implemented with 2 n, or 6, fan-in two gates while the smallest acyclic circuit implementing the same 2 n output functions requires at least (3 n−2), or 7, fan-in two gates. Thus, asymptotically, this cyclic circuit is two-thirds the size of any equivalent acyclic form.

In 1992, it was observed that cycles sometimes occur in combinational circuits synthesized from high-level designs, as well as circuits with bus structures. See L. Stok, "False Loops Through Resource Sharing," Int'l Conf. Computer-Aided Design, Santa Clara, 1992, pp. 345-348. Cycles were observed in designs that were optimized to re-use functional units. For instance, given functional units f(x) and g(x), these could be operations such as "add" and "shift" on a datapath x, and a controlling variable y, one might implement $z(x)$=if $y$ then f($g(x)$) else $g$(f($x$)).

Feedback in such designs is carefully contrived, typically occurring when functional units are connected in a cyclic topology. In was also noted that while high-level synthesis tools and/or human designers sometimes create such cyclic designs, logic synthesis and verification tools used at later stages in the design process have great difficulty because of cycles. Recently, it has been noted that cycles may arise in circuits synthesized from synchronous languages such as Esterel. See S. A. Edwards, "Making Cyclic Circuits Acyclic," Design Automation Conf., 2003. Because of the difficulties encountered by logic synthesis and verification tools, the solution to this problem is generally to disallow the creation of cycles in the resource-sharing phase of high-level synthesis, or to transform cyclic designs into acyclic designs.

In 1994 a technique for analyzing cyclic combinational circuits was proposed. See S. Malik, "Analysis of Cyclic Combinational Circuits," IEEE Trans. Computer-Aided Design, Vol. 13, No. 7, pp. 950-956, 1994. It has been proved that deciding whether a cyclic circuit is combinational or not is co-NP-complete. An efficient analysis algorithm was formulated based on ternary-valued simulation to decide whether a circuit is combinational. This work also addressed the issue of timing analysis, as well as fault testing. See A. Raghunathan, P. Ashar and S. Malik, "Test Generation for Cyclic Combinational Circuits," IEEE Trans. Computer-Aided Design, Vol. 14, No. 11, pp. 1408-1414, 1995.

Work in this area continued and in 1996 the earlier work was set on firm theoretical footing. See T. R. Shiple, "Formal Analysis of Synchronous Circuits," Ph.D. Thesis, University of California, Berkeley, 1996. It was shown that the class of circuits that Malik's procedure decides are combinational are precisely those that are well behaved electrically, according to the up-bounded inertial delay model. See J. A. Brzozowski and C. -J. H. Seger, Asynchronous Circuits, Springer-Verlag, 1995. Refinements were proposed to Malik's algorithm and extended the concept to sequences of inputs, rather than single input vectors, making the model more permissive in the case of combinational logic embedded in sequential systems. See T. R. Shiple, V. Singhal, R. K. Brayton, and A. L. Sangiovnni-Vincentelli, "Analysis of Combinational Cycles in Sequential Circuits," IEEE Int'l Symp Circuits and Systems, Vol. 4, pp. 592-595, 1996; and T. R. Shiple, G. Berry and H. Touati, "Constructive Analysis of Cyclic Circuits," European Design and Test Conf., 1996.

To summarize, combinational circuits have been observed, and their behavior formalized, well-understood and accepted. However, except for relatively simple cases of feedback at the level of functional units, combinational circuits are not designed with feedback in practice. Combinational circuits that have been designed with feedback have simple and regular feedback structures stemming from high-level constructs. See S. A. Edwards, "Making Cyclic Circuits Acyclic," Design Automation Conf., 2003; and A. Srinivasan and S. Malik, "Practical Analysis of Cyclic Combinational Circuits," IEEE Custom Integrated Circuits Conf., pp. 381-384, 1996. No one has attempted the synthesis of circuits with feedback at the logic level.

Feedback at the Logic Level

In accordance with the invention combinational circuits are synthesized to intentionally incorporate cycles. A variety of cyclic combinational examples have been generated that are stable and have fewer gates than any equivalent acyclic circuits. Most notably, a family of cyclic circuits has been generated that is asymptotically one half the size of the corresponding acyclic circuits.

This family of cyclic combinational circuits are not isolated examples: cyclic topologies are superior to acyclic topologies for a broad range of networks, from randomly generated designs, to small and large scale networks encountered in practice.

A general methodology is described for the synthesis of multi-level combinational circuits with cyclic topologies. The technique can introduce feedback in the substitution/ minimization phase of synthesis. The technique can also be used during logic synthesis to optimize a multi-level description by introducing cycles and potentially reducing the size of the resulting network. The technique has been incorporated into a general logic synthesis environment, namely the Berkeley SIS package, and performed trials on benchmark circuits and randomly generated examples. Many of the benchmark circuits were optimized significantly with feedback, with improvements of up to 25%. In trials with thousands of randomly generated examples, very nearly all had cyclic solutions superior to acyclic forms, with average improvements in the range of 5 to 10%.

Notation

In the following description, standard notation is used: addition (+) denotes disjunction (OR), multiplication denotes conjunction (AND), and an overline ($\overline{x}$) denotes negation (NOT). A model is used that is at a level of abstraction applicable in the technology-independent phase of logic synthesis. A network is constructed that computes boolean target functions $g_i(x_1, \ldots, x_m)$, $1 \leq i \leq m$ of boolean input variables $X_1, \ldots, X_m$. Internally, the network is specified as a collection of nodes and associated with each node is a node function $f_i$ and an internal variable $y_i$, $1 \leq i \leq n$. The node functions depend on internal variables and input variables. A directed edge is drawn from node i to node j if and only if the node function $f_j$ associated with node j depends on the internal variable $y_i$ associated with node i. A subset of the nodes are designated as output nodes. For output nodes, the target functions are the requisite output functions. In the following discussion, for the sake of readability, the same symbol for the node function, the target function and the associated internal variable are used in equations. For example, when a symbol $f_i$ is used on the left-hand side of an equation it refers to a function, and when used on the right-hand side it refers to the corresponding internal variable.

A network is combinational if and only if it computes unique boolean output values for each boolean input assignment. If there are "don't care" conditions on the inputs, then it is sufficient if the network computes unique boolean values for input assignments in the "care" set. This computation must hold regardless of the initial state and independently of all timing assumptions. As noted earlier, a cost of a network can be estimated by a measure of the sum of the literals in the factored form of the node expressions of the network. See R. K. Brayton, G. D. Hachtel, C. T. McMullen, and A. L. Sangiovanni-Vincentelli, "Multilevel Logic Synthesis"; Proceedings of the IEEE, Vol. 78, No. 2, pp 264-300, 1990.

The restriction operation (also known as the cofactor) of a function f with respect to a variable x, $$f|_{x=v},$$

refers to the assignment of the constant value $v \in \{0,1\}$ to x. The composition operation of a function f with respect to a variable x and a function g, $$f|_{x=g},$$

refers to the substitution of g for x in f. A function f depends upon a variable x if and only if $f|_{x=0}$ is not identically equal to $f|_{x=1}$. Call the variables that a function depends upon its support set.

The universal quantification operation (also known as consensus) yields a function $$\forall(y_1, \ldots, y_n)f$$

that equals 1 if and only if the given function f equals 1 for all $2^n$ assignments of boolean values to the variables $y_1, \ldots, y_n$. The existential quantification operation (also known as smoothing) yields a function $$\exists(y_1, \ldots, y_n)f$$

that equals 1 iff the given function f equals 1 for some assignment of boolean values to the variables $y_1, \ldots y_n$.

The marginal operation yields a function $$f\downarrow(y_1, \ldots, y_n)$$

that equals 1 if and only if the given function f is invariant for all $2^n$ assignments of boolean values to $y_1, \ldots, y_n$. For a single variable y, it equals 1 iff $f|_{y=0}$ agrees with $f|_{y=1}$, $$f\downarrow y = f|_{y=0} \cdot f|_{y=1} + \overline{f|_{y=0}/f_{y=1}}$$

(For a single variable, the marginal is the complement of what is known as the boolean difference.) For several variables $y_1, \ldots, y_n$, the marginal is computed as the universal quantification of the product of the marginals:

$$f\downarrow(y_1, \ldots, y_n) = \forall(y_1, \ldots, y_n)[(f\downarrow y_1) \cdots (f\downarrow y_n)].$$

(With several variables, the marginal is not the same as the complement of the boolean difference, in general.) For example, with $$f = x_1 + x_2 y_1 + x_3 y_2 + x_4 y_1 y_2,$$

then, $$f\downarrow y_1 = x_1 + x_3 y_2 + \overline{x}_2(\overline{x}_4 + \overline{y}_2)$$

$$f\downarrow y_2 = x_1 + x_2 y_1 + \overline{x}_3(\overline{x}_4 + \overline{y}_1)$$

$$f\downarrow(y_1, y_2) = x_1 + \overline{x}_2 \overline{x}_3 \overline{x}_4$$

Note that computing a marginal of n variables requires 0(n) symbolic operations.

Synthesis

A goal in multilevel logic synthesis, sometimes called random logic synthesis, is to obtain an optimal multilevel structured representation of a network. Multilevel logic synthesis typically consists of an iterative application of minimization, decomposition and restructuring operations. See "Multilevel Logic Synthesis", supra. An important operation is substitution, sometimes called "re-substitution", in which node functions are expressed or re-expressed in terms of other node functions as well their original inputs For example, consider the target functions below:

$$f_1 = \overline{x}_1 x_2 \overline{x}_3 + \overline{x}_2(x_1 + x_3),$$

$$f_2 = \overline{x}_1 \overline{x}_2 \overline{x}_3 + x_1(x_2 + x_3),$$

$$f_3 = \overline{x}_3(\overline{x}_1 + \overline{x}_2) + \overline{x}_1 \overline{x}_2.$$

Using the simplify command of the Berkeley SIS package to perform substitution/minimization, for example substituting $f_3$ into $f_1$ results in:

$$f_1 = f_3(x_1 + x_2) + \overline{x}_2 x_3$$

Substituting $f_3$ into $f_2$ results in:

$$f_2 = \overline{x}_1 \overline{x}_2 \overline{x}_3 + x_1 f_3$$

Substituting $f_2$ and $f_3$ into $f_1$ results in:

$$f_1 = \overline{x}_2 \overline{x}_3 + \overline{f}_2 f_3$$

For each target substitution, different sets of functions can be substituted. Each set can be referred to as a substitutional set. Different substitutional sets yield alternative functions of varying cost. In general, augmenting the set of functions available for substitution leaves the cost of the resulting expression unchanged or lowers it. Strictly speaking, this may not always be the case since the algorithms used are heuristic.

Figure 8:
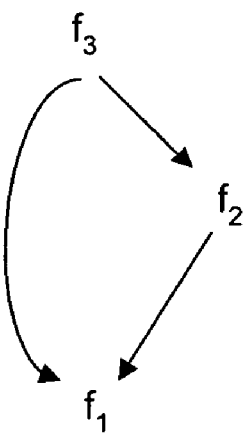
FIG. 8 is a network node diagram illustrating an acyclic substitution order.

In existing methodologies, a total ordering is enforced among the functions in the substitution phase to ensure that no cycles occur. This choice can influence the cost of the solution. With the ordering shown in FIG. 8, the substitution yields the network shown in FIG. 8 that has a cost of 14.

Figure 9:
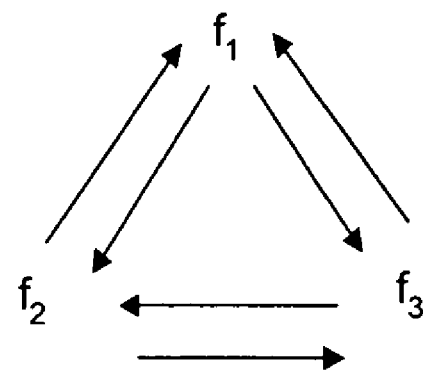
FIG. 9 is a network node diagram illustrating an unordered substitution.

Enforcing a hierarchical ordering is limiting because functions near the top of the hierarchy cannot be expressed in terms of others functions. For example, the function at the very top of the hierarchy cannot be expressed in terms of any other functions. Removal of the ordering restriction can lower the cost of implementing the network. For example, if every function can be substituted into every other function, the function shown in FIG. 9, with a cost of 12, can be implemented. The network in FIG. 9 is cyclic, but it is not combinational.

Another example of target functions is given below:

$$f_1(a,b,c)=a\bar{b}c+ab\bar{c},$$

$$f_2(a,b,c)=\bar{a}b+a\bar{b}+bc,$$

$$f_3(a,b,c)=ab+a\bar{c}+b\bar{c}.$$

Substituting $f_1$ into $f_2$ results in:

$$f_2=g_2(a,b,f_1)=\bar{f}_1 b+a\bar{b},$$

Or $f_2$ could be substituted into $f_1$ resulting in:

$$f_1=g_1(b,c,f_2)=f_2\bar{b}+\bar{f}_2 b.$$

Evaluation of the substitution of $f_3$ into $f_1$ finds that it isn't very helpful. For a given function $f_i$, dependent only on the primary inputs, substitution of a set of functions $F_1$ yields an expression dependent on a set of functions $F_2 \subseteq F_1$. In general, the resulting expression is not unique. Substitution may yield several alternative functions of varying cost. Also, in general, augmenting the set of functions available for substitution leaves the cost of the resulting expression unchanged or lowers it. Again, strictly speaking, this may not always be the case since the algorithms used in logic synthesis are heuristical, but exceptions are rare.

Figure 10:
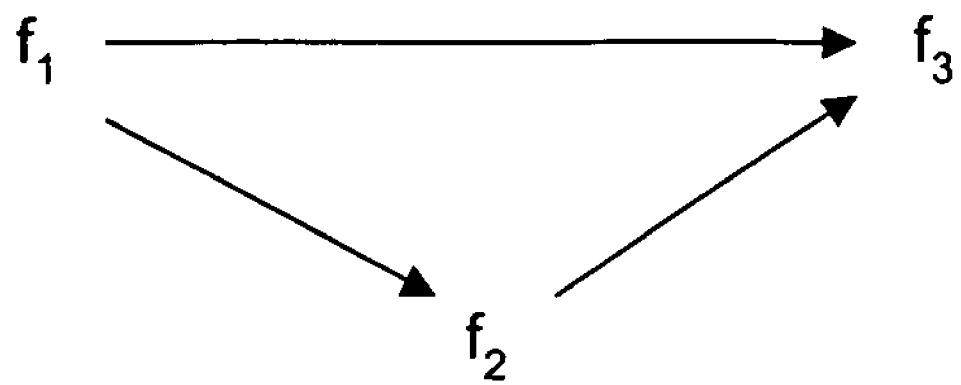
FIG. 10 is a network node diagram illustrating an ordering of a network.
Figure 11:
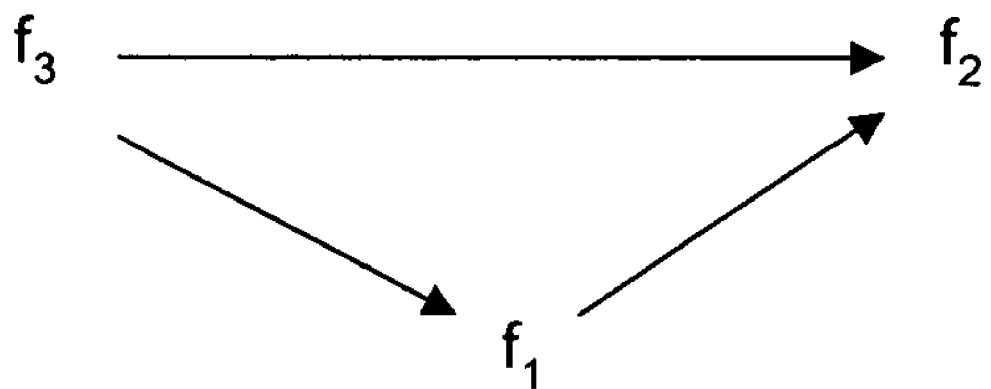
FIG. 11 is a network node diagram illustrating another ordering of a network.
Figure 12:
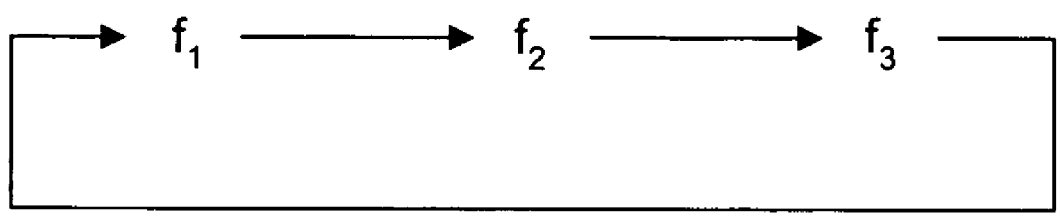
FIG. 12 is a network node diagram of yet another ordering of a network

As noted, in existing methodologies, a total ordering is enforced among the functions in the substitution phase in order to ensure that no cycles occur. This choice can influence the cost of the solution. For instance, with the ordering shown in FIG. 10, substitution yields:

$$f_1=g_1(a,b,c,)=a(b\,\overline{cb}c)$$

$$f_2=g_2(a,b,f_1)=b\bar{f}_1+a\bar{b}$$

$$f_3=g_3(a,b,c,f_1)=a\bar{f}_1+b\bar{c}$$

with a cost of 13, whereas the ordering shown in FIG. 11 yields:

$$f_1=\bar{b}cf_2+b\bar{f}_2$$

$$f_2=b(c+\bar{a})+a\bar{b}$$

$$f_3=a\bar{f}_1+b\bar{c}$$

with cost 14. As noted, an ordering is limiting because functions near the top cannot be expressed in terms of very many others. As illustrated, removal of this restriction can lower the cost. For example, if we allow every function to be substituted into every other, the network can be expressed as:

$$f_1=\bar{f}_2 b+\bar{f}_3 a$$

$$f_2=\bar{f}_1 b+a\bar{b}$$

$$f_3=\bar{f}_1 a+b\bar{c}$$

with cost of only 12. This network is cyclic, and not combinational. This may be verified according to well known procedures. For example, note that when a=1 and b=1, then $f_1=\bar{f}_2+\bar{f}_3, f_2=f_3=\bar{f}_1$. Note that if the order of substitution is restricted to that shown in FIG. 12, the network can be expressed as:

$$f_1=a(\bar{f}_3 b\bar{c})$$

$$f_2=b\bar{f}_1+a\bar{b}$$

$$f_3=\bar{c}f_2+ab$$

the network is combinational and has a cost of 12.

General Approach

First, assume that the network is given in collapsed form, that is to say, it is given as a set of output functions to implement. The set of functions that are used for substituting are referred to as the substitutional set. Given a substitutional set $F_j$, a node expression $g_i^{(j)}$ can be generated, or several expressions, $g_i^{(j-1)}, g_i^{(j-2)}, \ldots$, implementing an output function $f_i$. Beginning with the complete set of output functions $f_1, \ldots, f_{i-1}, f_{i+1}, \ldots, f_m$, down through the empty set, the expressions that are generated in this way are listed for each node. For a three node network, the list is illustrated in FIG. 13. In general, it is expected that the cost will decrease as each column in FIG. 13 is descended. For the empty set the node expression is simply the output function itself, possibly minimized.

A goal of the synthesis process is to select a choice of node expression that minimizes the cost while satisfying the conditions for stability and uniqueness. For a three node network, choose the i-th expression from the first column, the j-th expression from the second column and the k-th expression from the third column:

$$\text{Min}_{i,j,k}: \text{cost}(g_1^{(i)})+\text{cost}(g_2^{(j)})+\text{cost}(g_3^{(k)})$$

while satisfying $$C(g_1^{(i)}, g_2^{(j)}, g_3^{(k)}).$$

For a network with even a modest number of nodes, an exhaustive search is evidently intractable. With n nodes, there are $2^{n-1}$ substitutional sets for each node, so a total $n2^{n-1}$ possibilities. Fortunately, the structure of the search space immediately suggests the application of heuristics. One such heuristics, branch-and-bound is described.

A method of producing a combinational circuit includes determining cyclic parameters. Then a combinational circuit is synthesized in accordance with the cyclic parameters. The cyclic parameters can include defining at least one input variable and at least one output variable. A relationship between the input and output variable is defined, whereby the relationship includes a cycle. In addition, internal variables can be defined and can have a relationship to other variables defined that include cycles. The relationships between variables can include structured dependency between the variables and circuit constructs relating to the variables.

The cyclic parameters can be used in a logic synthesis process. For example, the cyclic parameters can be used in a structuring operation, such as in a substitution phase, of a logic synthesis process.

Branch-and-Bound

As noted previously, a goal of the synthesis process is to select a choice of node functions that optimizes various attributes of the network. For example, a network can be synthesized that minimizes the cost while satisfying the condition for combinationality. For each node, the lowest cost expression to be obtained is expected to be obtained with the full substitutional set, i.e., all other node functions. Likewise, it is expected that the highest cost expression to be obtained with the empty set. The cost of a network can be estimated by an area, and the area can be estimated by a literal count or gate count. Another example would be to optimize a network for performance. In one example, the performance can be measured as a delay of the combinational circuit. Other examples of optimization attributes include optimizing with regard to fault tolerance, power consumption, and testability. Following is a description of a branch-and-bound approach, as well as various heuristics that can be used for optimization.

Figure 14:
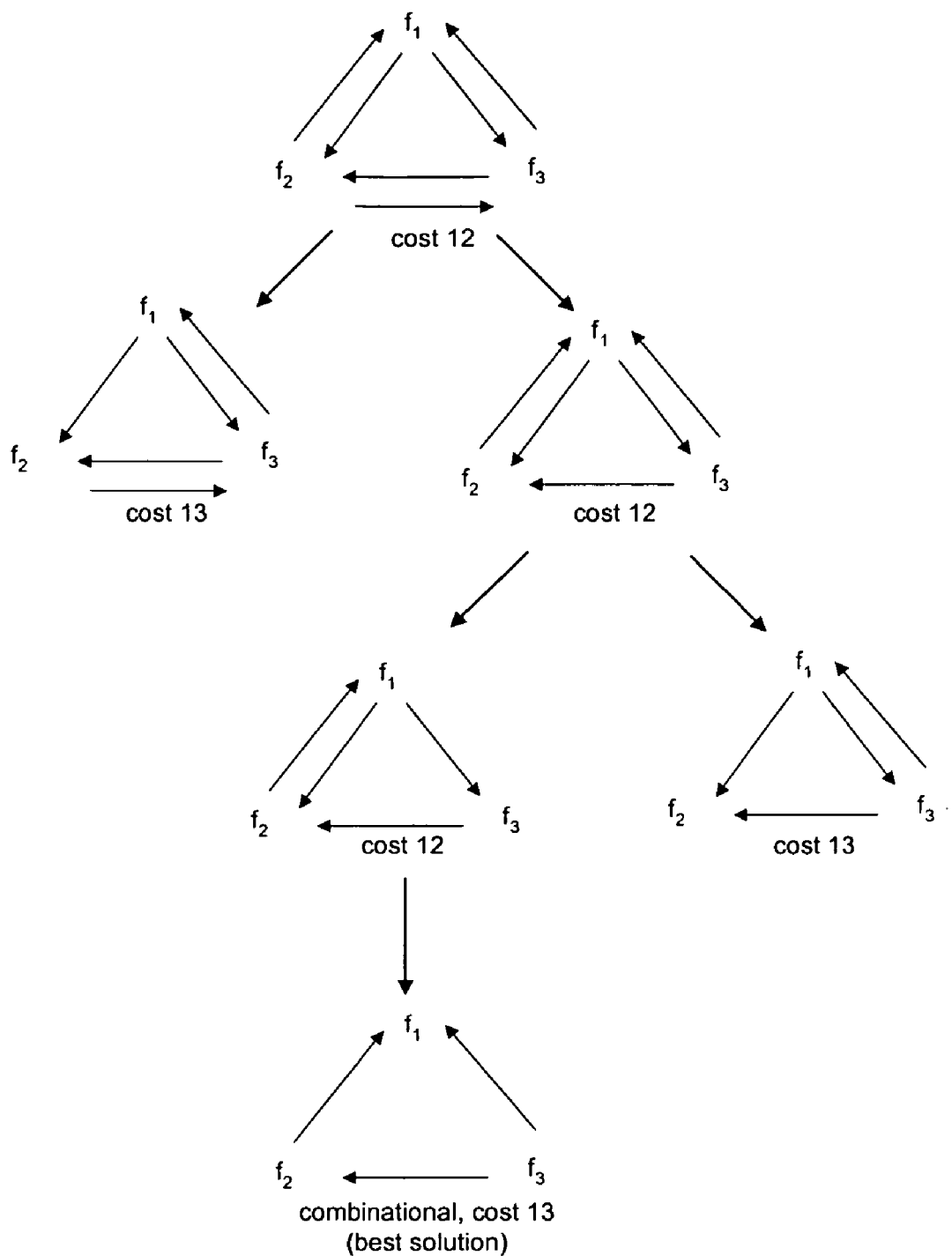
FIG. 14 is a set of network node diagrams illustrating a "break-down" search strategy.

The "Break-Down" Approach:

With this approach, the search is performed outside the space of combinational solutions. A branch terminates when it hits a combinational solution. The search begins with a maximally connected network as shown in FIG. 14. For each node $f_i$, a node expression $g_i^{(1)}$ is generated based on the complete substitutional set, i.e., all other nodes in the network. The dependency of a node function on another node is referred to as an "edge". This initial branch has the densest set of edges, and its cost provides a lower bound on the cost of the solution. As edges are excluded in the branch-and-bound process, the cost of the network remains unchanged or increases. Again, since the substitution step is based on heuristics, this may not be strictly true. In the "break-down" approach the following steps are followed:
 1. Analyze current branch for combinationality. If it is combinational, add it to the solution list. If it is not, select a set of edges to exclude based on the analysis,.
 2. For each edge in the set, create a new branch. Create a node expression, excluding the incident node from the substitutional set. If the cost of the new branch equals or exceeds that of a solution already found, kill the branch.
 3. Mark the current branch as "explored."
 4. Set the current branch to be the lowest-cost unexplored branch.
 5. Repeat steps 1-4 until the cost goal is met.

Figure 24:
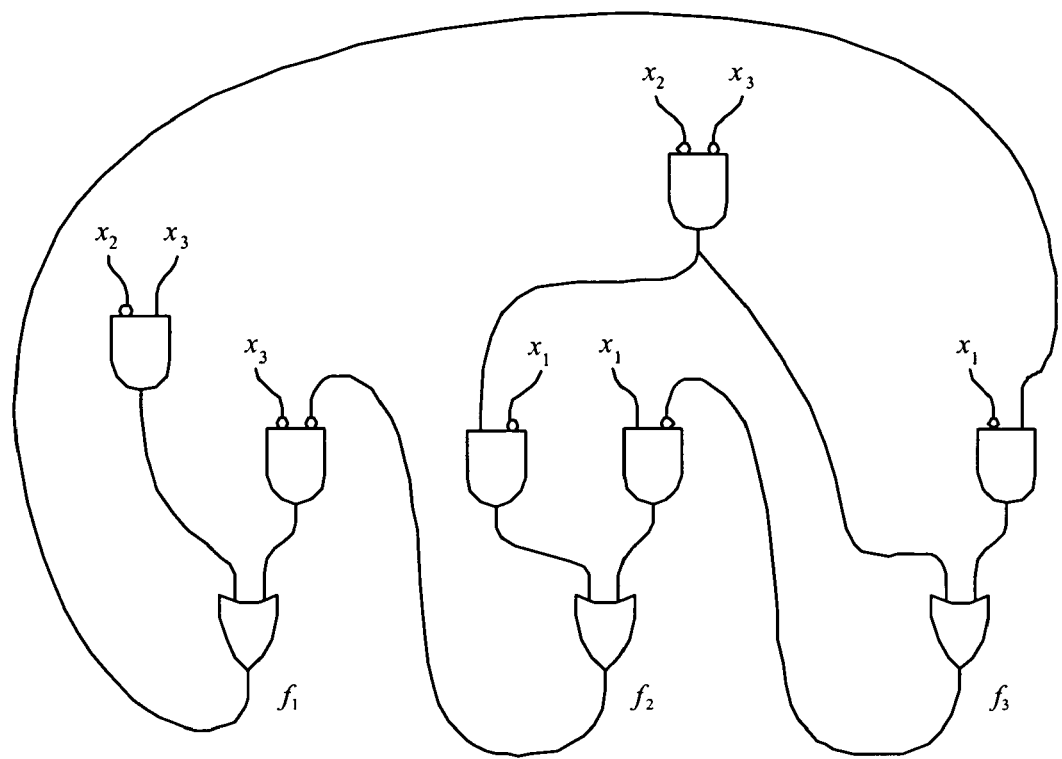
FIG. 24 is a block diagram illustrating an example of a circuit of the network described in FIG. 14.
Figure 24:
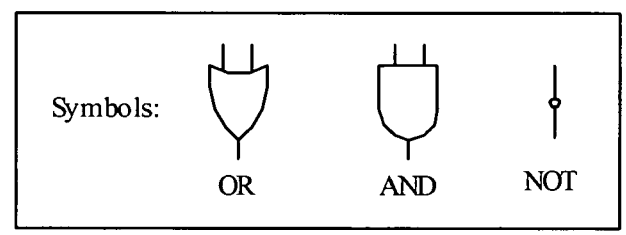

A sketch of the "break-down" approach is illustrated in FIG. 14. FIG. 14 does not illustrate a complete trace of the search, it only illustrates a trajectory to the solution shown. As shown in FIG. 14, the "break-down" approach yields a cyclic combinational solution with a cost of 13. This network can be mapped, for example, to a circuit with 9 fan-in two gates as shown in FIG. 24.

Figure 25:
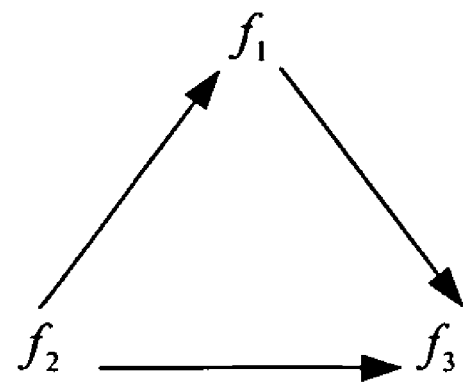
FIG. 25 is a diagram illustrating a cyclic solution for example target functions.

For the target function identified earlier, $f_1 = \bar{x}_1 x_2 \bar{x}_3 + \bar{x}_2(x_1 + x_3),$ $f_2 = \bar{x}_1 \bar{x}_2 \bar{x}_3 + x_1(x_2 + x_3),$ $f_3 = \bar{x}_3(\bar{x}_1 + \bar{x}_2) + \bar{x}_1 \bar{x}_2.$ the technique yields a combinational circuit with a cost of 13 as shown in FIG. 25.

Several ideas immediately suggest themselves for expediting the search heuristically. For example, the process can be prioritized slightly, at the expense of quality, such as, choosing branches that are "closer" to being combinational. Also, the density of edges can be limited a priori, or the set of edges can be pruned before creating new branches.

Figure 15:
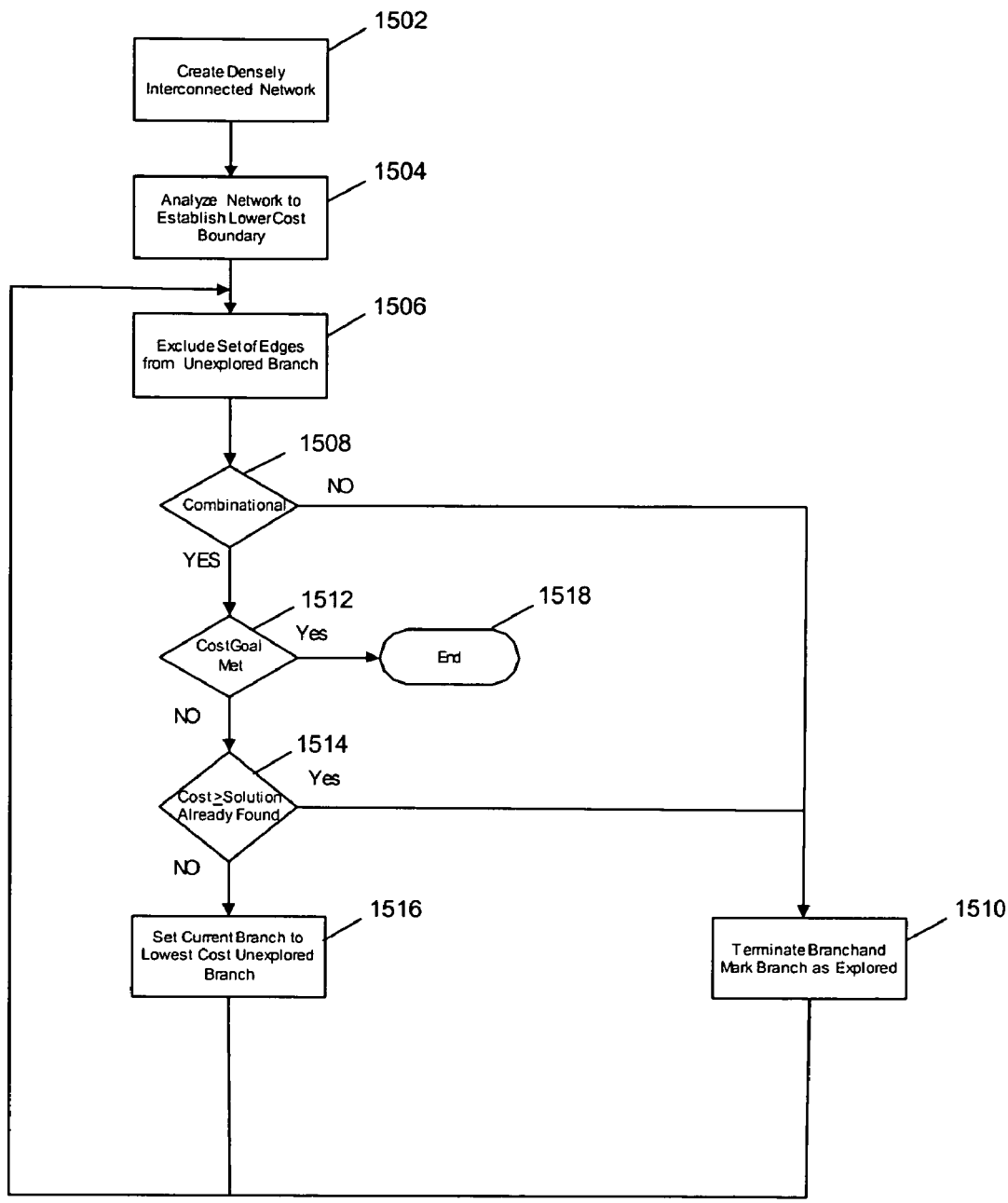
FIG. 15 is a flow diagram of the "break-down" search strategy.

FIG. 15 is a flow chart illustrating the "break-down" approach illustrated in FIG. 15. Flow begins in block 1502 where a densely interconnected network is created. Flow then continues to block 1504 where the network is analyzed to establish the lower cost boundary of the network. Flow then continues to block 1506 where a set of edges is excluded from an unexplored branch of the network.

Flow continues to block 1508 where the branch is evaluated to determine if the network is combinational. If the network is not combinational flow continues to block 1510 and the branch is terminated and marked as explored. Flow then continues to block 1506 and a set of edges is excluded from an unexplored branch.

Returning to block 1508, if the network is determined to be combinational then flow continues to block 1512. In block 1512 the cost of the network is determined and evaluated to determine if a cost goal has been met. If the cost goal has not been met flow continues to block 1514 where the cost of the current network is compared to the cost of solutions that have already been found. If the cost of the current network is greater than, or equal to, the cost of a solution that has already been found flow continues to block 1510 and the branch is terminated and marked as explored. If, in block 1514 it is determined that the cost of the current network is less than any solutions that have already been found, then flow continues to block 1516. In block 1516 the current branch is set to the lowest cost unexplored branch. Flow then continues to 1506.

Returning to block 1512, if it is determined that the cost goal has been met, then flow continues to block 1518 and flow terminates.

The "Build-Up" Approach:

With this approach, a search is performed inside the space of combinational solutions. A branch terminates when it hits a non-combinational solution. The search begins with an empty edge set, that is the target functions. Edges are added as the substitutional sets of nodes are augmented. As edges are included, the cost of the network decreases. The process is:
 1. Analyze current branch for combinationality. If it is not combinational discard it. If it is combinational, select a set of edges to include based on the analysis.
 2. For each edge in the set, create a new branch. Create a new node expression, including the incident node from the substitution set.
 3. Mark the current branch as "explored".
 4. Set the current branch to be the lowest-cost unexplored branch.
 5. Repeat steps 1-4 until the cost goal is met.

Figure 16:
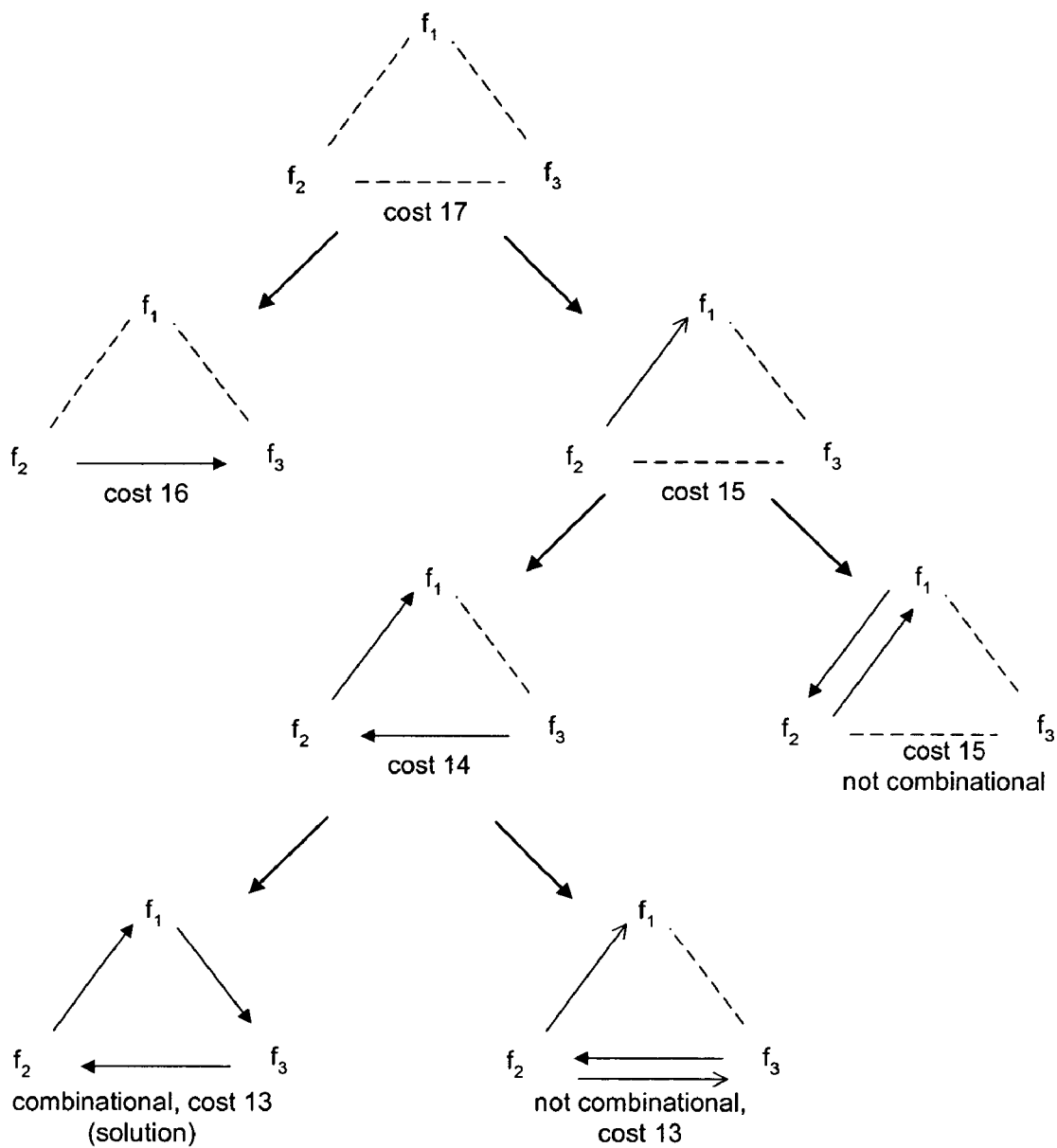
FIG. 16 is a set of network node diagrams illustrating a "build-up" search strategy.

A sketch of the "build-up" approach is illustrated in FIG. 16. FIG. 16 does not illustrate a complete trace of the search, it only illustrates a trajectory to the solution shown. This technique yields the same cyclic combinational solution for the target functions, as shown in FIG. 25.

With the "build-up" approach branches cannot be pruned through a lower-bound analysis. However, exploring within the space of combinational solutions ensures that incrementally better solutions are found as the computation proceeds.

As an alternative existing acyclic solutions may be used as a starting point. Adding edges reduces costs but potentially introduces cycles.

In general, the "break-down" approach performs best on dense examples, whereas the "build-up" approach performs better on sparse examples. In addition, a hybrid "build-up"/"break-down" approach may be feasible where features of the two approaches are combined to arrive at a solution.

Figure 17:
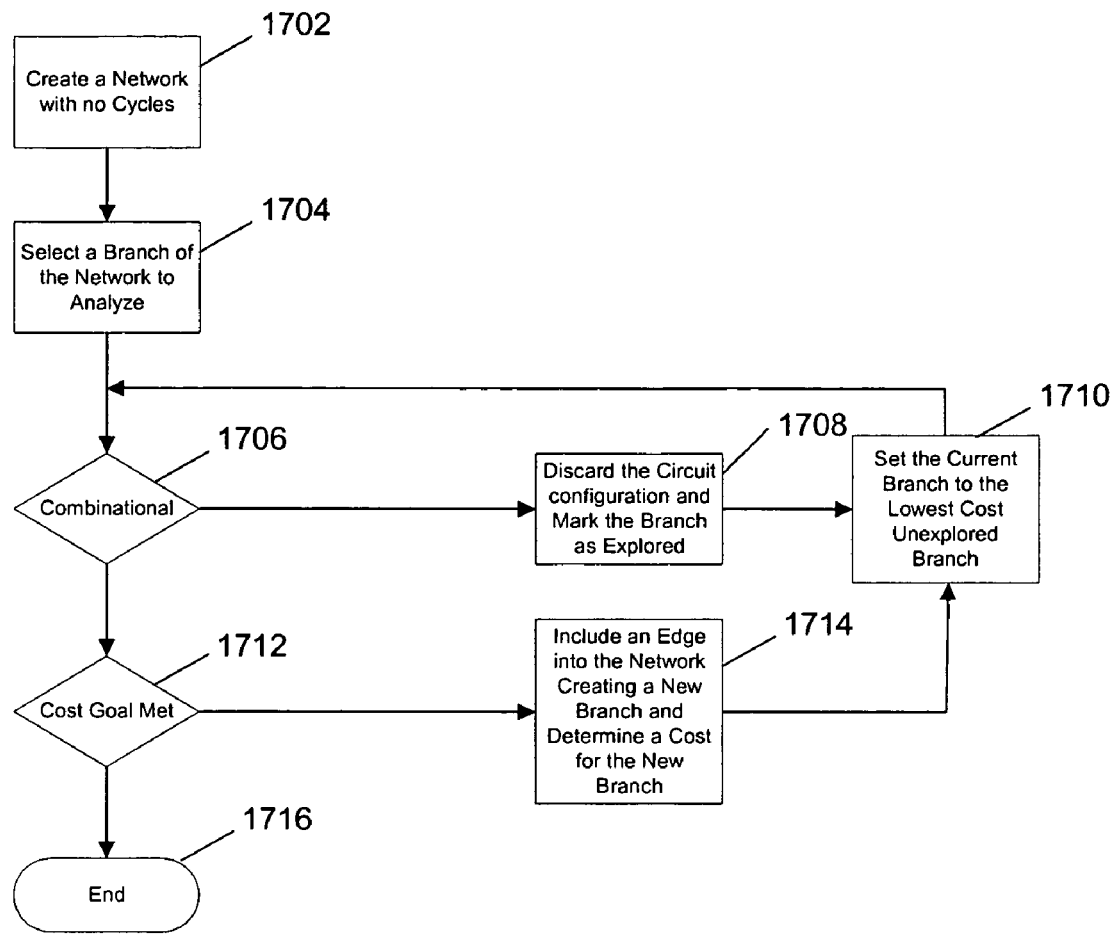
FIG. 17 is a flow chart of the "build-up" search strategy.

FIG. 17 is a flow chart illustrating the "build-up" approach illustrated in FIG. 16. Flow begins in block 1702 where a network with no cycles is created. Flow continues to block 1704 where a branch of the network is selected to analyze. Flow continues to block 1706 where it is determined if the branch is combinational. If the branch is not combinational flow continues to block 1708 where the circuit configuration of the current branch is discarded and the branch marked as explored. Flow continues to block 1710 where the current branch is set to the lowest cost. Flow then continues to block 1706.

Returning to Block 1706 if it is determined that the branch is combinational flow continues to block 1712 where it is determined if a desired cost goal has been satisfied. If the cost goal has not been satisfied flow continues to block 1714 where an edge is included in the network creating a new branch and a cost of the new branch determined. Flow then continues to block 1710.

Returning to block 1712, if the cost goal is satisfied then flow continues to block 1716 and flow terminates.

Analysis of Combinational Circuits for Synthesis

As noted earlier, a network is combinational if and only if, for each assignment of boolean values to the inputs, all output nodes in the simplified induced network evaluate to definite boolean values. This definition of combinationality is functionally equivalent to that proposed in earlier work. For example, a ternary model for the analysis of cyclic combinational circuits has been proposed. See S. Malik, "Analysis of Cyclic Combinational Circuits," IEEE Trans. Computer-Aided Design, Vol. 13, No. 7, pp. 950-956, 1994, and R. E. Bryant, "Boolean Analysis of MOS Circuits," IEEE Trans. Computer-Aided Design, pp. 634-649, 1987. One approach for deciding combinationality is based on ternary-valued simulation that uses a "dual-rail" encoding, 10 for one, 01 for zero, and 11 for "unknown", to reduce the problem to boolean simulation.

Analysis

A symbolic framework is formulated for analysis that obviates the need for ternary-valued simulation. The problem is approached with a "divide-and-conquer" technique: progressively smaller components of the network are analyzed for combinationality. It is noted that if a network's dependency graph can be divided into several distinct strongly connected components, then the analysis may be performed separately on each component. For simplicity, it is assumed that each node in the network is an output node.

Symbolic Framework

Input assignments are analyzed, when substituted into a node function, to determine which inputs force the node function to a definite boolean value, independent of all internal variables in its support set. For a node function $f_i$, let $I_i$ be the set of internal variables that it depends upon. Then:

$f_i \downarrow I_i$ holds, then $f_i$ has a definite boolean value equal to the corresponding target function $g_i$. For a network N, to obtain the restriction:

$N|f_i$ the node $f_i$ is removed, and the corresponding target function $g_i$ is substituted for the internal variable $y_i$ in every node function in which it appears. This restriction is an auxiliary construct for analysis, not an attempt to redesign the network under consideration.

Let C(N) denote the necessary and sufficient condition for combinationality, expressed as a function of the input variables. The following provides a technique to compute this condition:

$C(N) = [f_1 \downarrow I_1] \cdot C(N|f_1) + \ldots + [f_n \downarrow I_n] \cdot C(N|f_n).$ For a network with cycles, for each input assignment at least one node function needs to evaluate to a definite boolean value independently of all the others. Indeed, if none of the functions evaluates to a definite boolean value, then no simplifications are possible and the network is not combinational. A function $f_i$ evaluates to a definite boolean value independently of the others if and only if the marginal holds, $f_i \downarrow I_i.$ Now, if a node function $f_i$ evaluates to a definite boolean value, this value is given by the corresponding target function $g_i$. If this node is cut from the network, then the rest of the network must be combinational, that is, $C(N|f_i)$ Indeed, if a component of the network viewed in isolation is not combinational, then the entire network is not combinational.

Several examples will illustrate the analysis.

$d = \bar{c}(\bar{a} = \bar{b}) + \overline{ab}$ $e = \bar{a}b\bar{c} + \bar{b}(a+c)$ $f = \bar{b}(\bar{a}+\bar{c}) + ab.$

EXAMPLE 1

Figure 18:
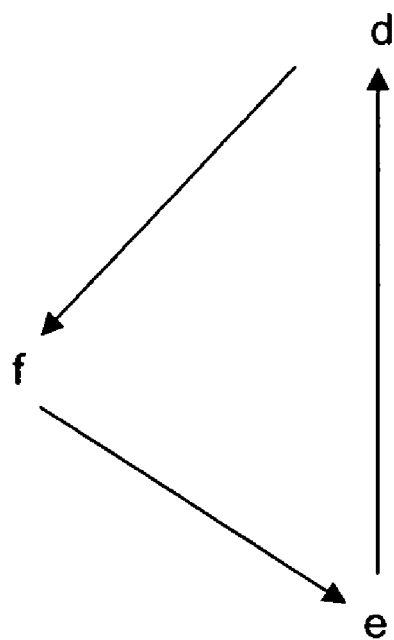
FIG. 18 is an example network node diagram

Consider the network $N_1$, shown in FIG. 18. Note that the dependency graph is a single cycle. A necessary and sufficient condition for combinationality is $$C(N_1) = [d \downarrow e] \cdot C(N_1|d) + [e \downarrow f] \cdot C(N_1|e) + [f \downarrow d] \cdot C(N_1|f).$$

The marginals are $d \downarrow e = a + \overline{bc}$ $e \downarrow f = c + a\bar{b}$ $f \downarrow d = b.$ Because there is a single cycle, $C(N_1|d) = C(N_1|e) = C(N_1|f) \equiv 1.$ Thus, $C(N_1) = a + \overline{bc} + c + a\bar{b} + b = 1.$ It is concluded that the network is combinational for all input assignments.

EXAMPLE 2

Figure 19:
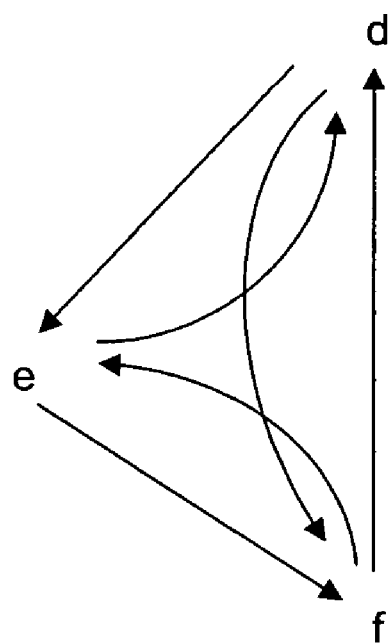
FIG. 19 is an example network node diagram.

Now, consider the network $N_2$, shown in FIG. 19. Note that the dependency graph is the complete graph on three nodes. The necessary and sufficient condition for combinationality is $$C(N_2) = [d\downarrow(e,f)] \cdot C(N_2|_d) +$$
$$[e\downarrow(d,f)] \cdot C(N_2|_e) +$$
$$[f\downarrow(d,e)] \cdot C(N_2|_f)$$

$d=\bar{b}f+\bar{c}e$ $e=d(a+\bar{f})+\bar{b}c$ $f=a\bar{e}+\bar{b}d$.

The marginals are $d\downarrow(e,f)=bc$ $e\downarrow(d,f)=\bar{b}c$ $f\downarrow(d,e)=\bar{a}b$.

For the restriction $N_2|_d$, compute $e|_d=\bar{b}(a+c)+\overline{acf}$ $f|_d=\bar{b}(\bar{a}+\bar{c})+a\bar{e}$ For this restriction, the marginals are $(e|_d)\downarrow f=a+c$ $(f|_d)\downarrow e=\bar{a}+\bar{bc}$ Now, recursively, $$C(N_2|_d) = [(e|_d)\downarrow f] \cdot (1) + [(f|_d)\downarrow e] \cdot (1)$$
$$= a + c + \bar{a} + \bar{b}\bar{c}$$
$$= 1.$$

Similarly, compute $C(N_2|_e)=0$ $C(N_2|_f)=\bar{b}+c$

Thus, $$C(N_2) = (bc) \cdot (1) + (\bar{b}c) \cdot (0) + (\bar{a}b) \cdot (\bar{b}+c)$$
$$= bc$$

It is concluded that the network is combinational iff $b=c=1$.

EXAMPLE 3

Figure 20A:
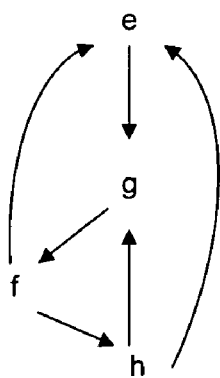
FIG. 20A is yet another example node diagram.

Now, consider the network shown in FIG. 20A.

$e=\bar{f}(a\bar{h}+c)+d\bar{h}+\bar{b}$ $f=\overline{adg}+a(\bar{b}d+bc)$ $g=\overline{ab}\bar{c}+\bar{h}(a\bar{e}+\bar{a}d+\bar{b}c)$ $h=\bar{f}(a(c+d)+cd)$ The target functions for this network are $e=a\overline{cd}+d(c+\bar{a})+\bar{b}$ $f=ad(c+\bar{b})+\bar{d}(\overline{abc}+bc)$ $g=\overline{ac}(d+b)+c(a\bar{b}d+\bar{d}(\overline{ab}+ab))$ $h=\overline{ab}c\bar{d}+d(ab\bar{c}+\bar{a}c)$ The network is combinational if and only if the following condition holds $$C(N) = [e\downarrow(f,h)] \cdot C(N|_e) + [f\downarrow g] \cdot C(N|_f) +$$
$$[g\downarrow(e,h)] \cdot C(N|_g) + [h\downarrow f] \cdot C(N|_h).$$

Proceeding on a case basis:

Case I:

Suppose that e assumes a definite boolean value independently of f and h:

$e\downarrow(f,h)=\overline{acd}+\bar{b}$

Figure 20B:
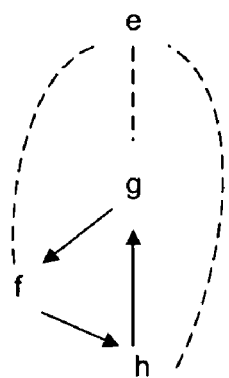
FIG. 20B is one case of the network node diagram of FIG. 20.

Given this predicate, the sub-network $N|_e$ is obtained by substituting the target function for e into g, see FIG. 20B:

$f=\overline{adg}+a(\bar{b}d+bc)$ $g|_e=\overline{ab}\bar{c}+\bar{h}(c(a\bar{d}+\bar{b})+d(\bar{b}\bar{c}+\bar{a}))$ $h=\bar{f}(a(c+d)+cd)$ Note that $N|_e$ contains a single cycle through nodes f, h and $g|_e$. There are three subcases:
1) suppose that f assumes a definite boolean value independently of $g|_e$:

$f\downarrow(g|_e)+a+d$, 2) suppose that $g|_e$ assumes a definite boolean value independently of h:

$(g|_e)\downarrow h=b(acd+\overline{ad})+\bar{c}(a\bar{b}+\bar{a}b+\bar{d})$ 3) suppose that h assumes a definite boolean value independently of f:

$h\downarrow f=\bar{d}(\bar{a}+\bar{c})+\overline{ac}$

In each case, the assumption breaks the cycle. Assembling the three cases, $C(N|_e)=[f\downarrow(g|_e)]+[(g|_e)\downarrow h]+[h\downarrow f]\equiv 1$.

It is concluded that the sub-network $N|_e$ is combinational.

Case II:

Suppose that f assumes a definite boolean value independently of g:

$f\downarrow g=a+d$.

Figure 20C:
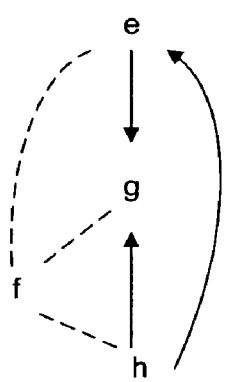
FIG. 20C is another case of the network node diagram of FIG. 20.

Given this predicate, the sub-network $N|_f$ is obtained by substituting the target function for f into h, see FIG. 20C, $e=\bar{f}(a\bar{h}+c)+d\bar{h}+\bar{b}$ $g=\overline{ab}\bar{c}+\bar{h}(a\bar{e}+\bar{a}d+\bar{b}c)$ $h|_f=\overline{ab}c\bar{d}+d(ab\bar{c}+\bar{a}c)$ This sub-network is acyclic and hence combinational: $C(N|_f)\equiv 1$.

Case III:

Suppose that g assumes a definite boolean value independently of e and h:

$$g\downarrow(e,h)=\overline{a}(\overline{d}(b+\overline{c})+b\overline{c})$$

Figure 20D:
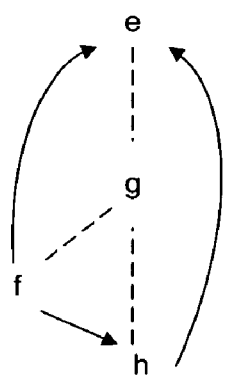
FIG. 20D is another case of the network node diagram of FIG. 20.

Given this predicate, the sub-network $N|_g$ is obtained by substituting the target function for g into f, see FIG. 20D, $$e=\overline{f}(a\overline{h}+c)+d\overline{h}+\overline{b}$$

$$f|_g=a(\overline{b}d+bc)+\overline{d}(\overline{abc}+bc)$$

$$h=\overline{f}(a(c+d)+cd)$$

This sub-network is acyclic and hence combinational: $C(N|_g)\equiv 1$.

Case IV:

Finally, suppose that h assumes a definite boolean value independently of f:

$$h\downarrow f=\overline{d}(\overline{a}+\overline{c})+\overline{ac}$$

Figure 20E:
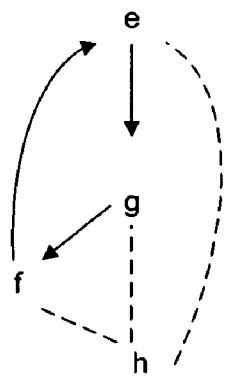
FIG. 20E is another case of the network node diagram of FIG. 20.

Given this predicate, the sub-network $N|_h$ is obtained by substituting the target function for h into e, see FIG. 20E, $$e|_h=d(\overline{ac}+ac)+\overline{f}(a\overline{d}+c)+\overline{b}$$

$$f=\overline{ad}g+a(\overline{b}d+bc)$$

$$g=\overline{abc}+\overline{h}(a\overline{e}+\overline{a}d+\overline{b}c)$$

Analyzing $N|_h$ in the same manner as in Case I, we find that $C(N|_h)\equiv 1$ Assembling the four cases, $$C(N) = [e\downarrow(f, h)]\cdot(1) + [f\downarrow g]\cdot(1) +$$
$$[g\downarrow(e, h)]\cdot(1) + [h\downarrow f]\cdot(1)$$
$$\equiv 1$$

Thus we conclude that the network in FIG. 20A is combinational.

Complexity

It has been shown that the problem of analyzing a network to determine if it is combinational is co-NP-complete. See "Analysis of Cyclic Combinational Circuits" supra. In the recursive decomposition of the necessary and sufficient condition for combinationality, one may encounter the same sub-network several times. Restriction is invariant to order so that for any i,j, $$(N|_{f_i})|_{f_j}=(i\ N|_{f_j})|_{f_i}$$

It is not necessary to recompute the condition for the same component encountered twice. For instance, in a network with nodes, $f_1, f_2, \ldots$, compute $$C(N)=(f_1\downarrow y_1)\cdot C(N|_{f_1})+(f_2\downarrow y_2)\cdot C(N|_{f_2})+$$

Recursively, compute $$C(N|_{f_1})=((f_2|_{y_1})|_{y_2})\cdot C((N|_{f_1})|_{f_2})+$$

and $$C(N|_{f_2})=((f_1|_{y_2})|_{y_1})\cdot C((N|_{f_2})|_{f_1})+$$

It is not necessary to recompute $(N|_{f_2})|_{f_1}$, as it is equal to $(N|_{f_1})|_{f_2}$.

For a network corresponding to a complete graph on n nodes, the analysis requires on the order of $n\cdot 2^n$ steps (there are $2^n$ subsets of n nodes, each of which has n terms to evaluate). For less densely connected networks, the analysis is, of course, less complex.

Timing

For timing analysis, an approach is to transform a cyclic circuit into an equivalent acyclic one. See S. A. Edwards, "Marking Cyclic Circuits Acyclic," Design Automation Conf., 2003. Timing information is then obtained through functional timing analysis of the acyclic circuit. Timing analysis can be performed directly on a cyclic combinational circuit. In fact, timing analysis is closely related to combinationality analysis. In timing analysis, the goal is to find the longest sensitized path; in combinationality analysis, the goal is to ascertain whether there are any sensitized cycles (i.e., sensitized paths that bite their own tail).

Synthesis Algorithms

As noted, a goal in multilevel logic synthesis (also sometimes called random logic synthesis) is to obtain the optimal multilevel, structured representation of a network. The process typically consists of an iterative application of minimization, decomposition, and restructuring operations. See "Multilevel Logic Synthesis" supra. An important operation is substitution, in which node functions are expressed, or re-expressed, in terms of other node functions as well as of their original inputs. Our strategy is to introduce combinational cycles in the substitution phase. Several approaches have been explored, including dynamic programming and branch-and-bound algorithms. The interplay of analysis and synthesis in the design process is discussed.

The analysis is formulated recursively. Accordingly, it permits caching analysis results for common sub-networks through iterations of the search for a solution. Suppose that in the course of a search for a low-cost combinational solution a network $N_1$, is considered, with node functions.

$$f_1,\ldots,f_n.$$

Analysis for combinationality entails evaluating the expression $C(N_1)$, discussed earlier. Next, suppose that a network $N_2$ is considered, with node functions $$f_1,\ldots,f_n.$$

Analysis entails evaluating $C(N_2)$. Now suppose that some of the node functions in $N_1$ are identical to those in $N_2$. Let S be the subset of nodes that are identical:

$$\forall i\in S, f_i\equiv f'_i.$$

The evaluation of C(S) figures in both $C(N_1)$ and $C(N_2)$, and so it need not be repeated. If, in the process of evaluating $C(N_1)$, we find that $C(S)=0$, then we rule out $N_1$ as well as $N_2$ (and all other networks that contain S). Otherwise, we find that $C(S)\equiv 1$, and we need not re-evaluate it when evaluating $N_2$ (or any other network that contains S). This is illustrated by the following examples.

EXAMPLE 1

Figure 21:
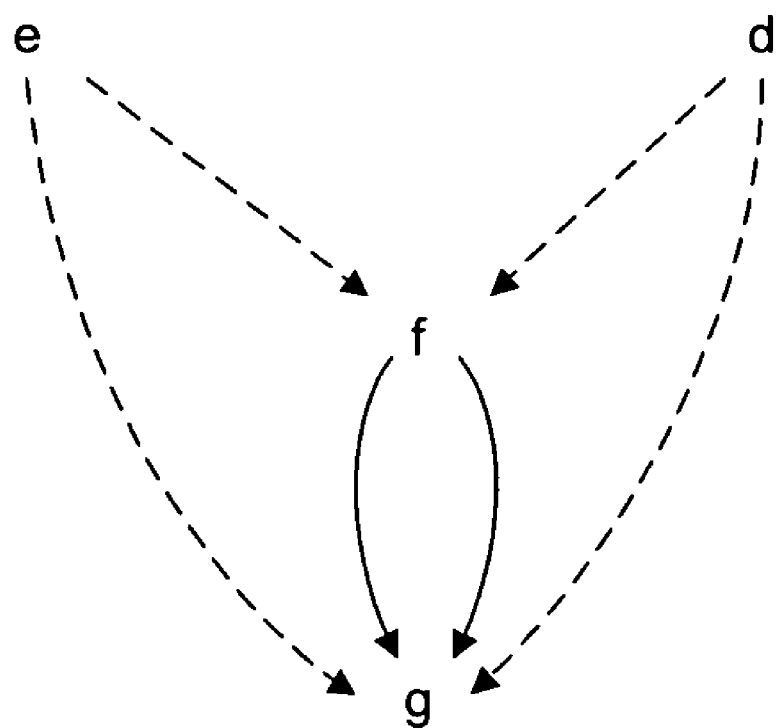
FIG. 21 is an example of a network node diagram.

Consider again the example in FIG. 20A. Suppose that the network is constructed for nodes f and g shown in FIG. 21, assuming that nodes e and h are given.

Analysis $$f=\overline{agh}+a(de+g)$$

$$g=\overline{afh}+f(a\overline{e}+\overline{b}c)$$

accordingly this component is not combinational. Thus, we exclude this pair of node functions as candidates for f and g.

EXAMPLE 2

Figure 22:
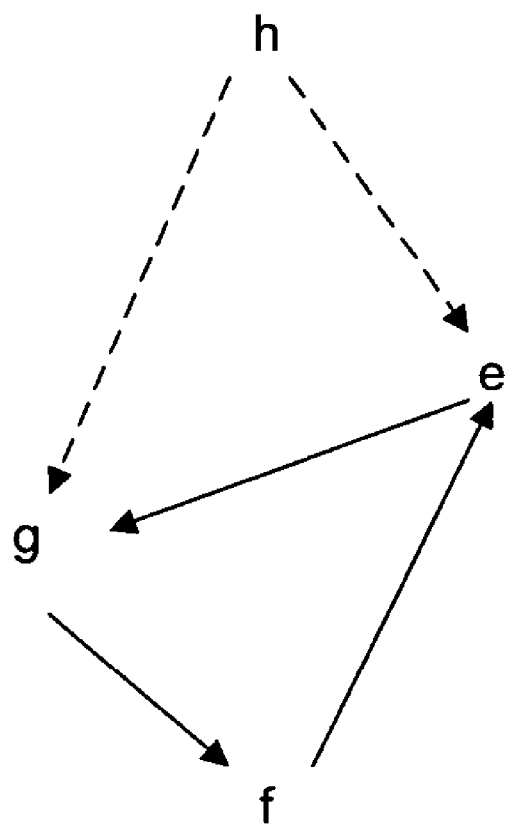
FIG. 22 is another example of a network node diagram.

Now, suppose that the candidates for nodes e,f and g are constructed as shown in FIG. 22.

$$e = \overline{f}(a\overline{h}+c)+d\overline{h}+\overline{b}$$

$$f = \overline{adg} + a(\overline{b}d+bc)$$

$$g = \overline{abc} + \overline{h}(a\overline{e}+\overline{a}d+\overline{b}c)$$

Analysis confirms that this component is combinational. Proceeding to select a node function for h, the candidates are:

$$h_1 = c(a\overline{d}e+\overline{a}d)+d\overline{e}$$

$$h_2 = \overline{f}(a(c+d)+cd)$$

$$h_3 = \overline{g}(d(b\overline{c}+\overline{a})+\overline{b}c)$$

$$h_4 = c\overline{f}(a+d)+d\overline{e}$$

$$h_5 = \overline{fg}(c+d)$$

$$h_6 + c\overline{fg} + d\overline{e}$$

When analyzing networks constructed with these candidates for h, it need not re-evaluate the component e, f, g from FIG. 22. It is found that if $h_2$ is combined with this component, it yields a combinational network (that shown in FIG. 20).

CONCLUSION

As illustrated above, cyclic solutions are not a rarity and they can readily be found for most sufficiently rich circuits. Trials have been run on a range of randomly generated examples, as well as some of the usual suspects, namely the Espresso and LGSynth93 benchmarks. See the benchmarks in the Proceedings of the IEEE International Workshop on Logic Synthesis, May 1993, and by R. K. Brayton, G. D. Hachtel, C. T. McMullen, and A. L. Sangiovanni-Vincentelli, "Logic Minimization Algorithms for VLSI Synthesis", Kluwer Academic Publishers, Boston, 1984. It is noted that solutions for many of the examples have deeply nested loops, with dozens or even hundreds of cycles.

In the trials, the input generally consists of a collapsed network, that is to say expressions for the output functions $f_1, \ldots, f_p$ expressed in terms of the primary inputs. A substitution operation is performed with the simplify command in the Berkeley SIS package, with parameters: method=nocomp/snocomp, dctype=all, filter=exact, accept=fct-lits. The cost given is that of the resulting network, as measured by the literal count of the nodes expressed in factored form. This is compared to the cost of the network obtained by executing simplify directly on the collapsed network, with the same parameters.

Since randomly generated functions are typically very dense, they are not generally representative of functions encountered in practice. Nevertheless, it is interesting to examine the performance of the CYCLIFY program on these. Table 1 below lists the results of some tests comparing the acyclic (simplify) and cyclic (cyclify) costs of benchmarks, and the corresponding improvements. Table 2 lists cost improvements of CYCLIFY over the Berkeley SIS Simplify for randomly generated networks.

TABLE 1

|  | Simplify | Cyclify | Improvements | Time (H:M:S) |
|---|---|---|---|---|
| Espresso Benchmarks | | | | |
| P82 | 104 | 90 | 13.5% | 00:02:03 |
| T4 | 109 | 89 | 18.3% | 00:00:02 |
| Dc2 | 130 | 123 | 5.4% | 00:01:34 |
| Apla | 185 | 131 | 29.2% | 00:00:31 |
| Tms | 185 | 158 | 14.6% | 00:01:17 |
| M2 | 231 | 207 | 10.4% | 00:06:02 |
| T1 | 273 | 206 | 24.5% | 00:21:40 |
| B4 | 292 | 281 | 3.8% | 00:09:50 |
| Exp | 320 | 260 | 18.8% | 00:33:26 |
| In3 | 361 | 333 | 7.8% | 00:22:06 |
| In2 | 397 | 291 | 26.7% | 00:00:45 |
| B10 | 398 | 359 | 9.8% | 00:08:29 |
| Gary | 421 | 404 | 4.0% | 00:18:15 |
| M4 | 439 | 421 | 6.2% | 00:07:22 |
| In0 | 451 | 434 | 3.8% | 00:05:53 |
| Max1025 | 793 | 774 | 2.4% | 00:00:29 |
| LGSynth93 Benchmark | | | | |
| ex6 | 85 | 76 | 10.6% | 00:00:06 |
| inc | 116 | 112 | 3.4% | 00:00:04 |
| bbsse | 118 | 106 | 10.2% | 00:00:08 |
| sse | 118 | 106 | 10.2% | 00:00:10 |
| 5xp1 | 123 | 109 | 11.4% | 00:00:01 |
| S386 | 131 | 113 | 13.7% | 00:00:08 |
| bw | 171 | 163 | 4.7% | 00:15:41 |
| S400 | 179 | 165 | 7.8% | 00:02:12 |
| S382 | 180 | 165 | 8.3% | 00:02:30 |
| S526n | 194 | 189 | 2.6% | 00:00:29 |
| S526 | 196 | 188 | 4.1% | 00:00:25 |
| cse | 212 | 177 | 16.5% | 00:00:05 |
| clip | 213 | 193 | 9.4% | 00:00:01 |
| pma | 226 | 211 | 6.6% | 00:04:30 |
| dk16 | 248 | 233 | 6.0% | 00:00:53 |
| S510 | 260 | 227 | 12.7% | 00:000:05 |
| ex1 | 309 | 276 | 10.7% | 00:09:11 |
| S1 | 332 | 322 | 3.0% | 00:03:34 |
| duke2 | 415 | 397 | 4.3% | 00:02:58 |
| styr | 474 | 443 | 6.5% | 00:03:24 |
| planet1 | 550 | 517 | 6.0% | 05:09:19 |
| planet | 555 | 504 | 9.2% | 02:57:47 |
| S1488 | 622 | 589 | 5.3% | 00:47:04 |
| S1494 | 659 | 634 | 3.8% | 05:19:41 |
| table3 | 1287 | 1175 | 8.7% | 12:39:20 |
| table5 | 1059 | 1007 | 4.9% | 14:10:10 |
| S298 | 2598 | 2445 | 5.9% | 10:15:13 |
| ex1010 | 3703 | 3593 | 3.0% | 10:57:58 |

TABLE 2

Randomly Generated Networks

| # In | # Out | Cyclic Solns Found | Avg. Improvement | Improvement Range |
|---|---|---|---|---|
| 5 | 5 | 100% | 8.5% | 3%-17% |
| 5 | 7 | 96% | 9.1% | 0%-18% |
| 5 | 10 | 100% | 12.0% | 2%-20% |
| 5 | 15 | 100% | 13.4% | 7%-23% |
| 5 | 20 | 100% | 14.2% | 8%-18% |
| 7 | 10 | 96% | 5.6% | 0%-11% |
| 7 | 15 | 88% | 3.6% | 0%-10% |

As illustrated, a paradigm shift in combinational circuit design is appropriate: combinational logic should no longer be thought of as acyclic in theory or in practice, since nearly all combinational circuits are best designed with cycles. A general methodology has been formulated for the synthesis of cyclic combinational circuits, and incorporated into a logic synthesis environment. Search processes have been described that, while heuristic, can effectively tackle circuits of sizes that are of practical importance. The implementation of more sophisticated search processes, such as stochastic search, and parallelization are obvious evolutions of the project. Furthermore, the techniques described can be extended to the technology mapping phase of logic synthesis.

The circuit synthesis process described above can be implemented in a wide variety of processor devices. For example, a logic synthesis system can include processors that accept a high-level description language specification of variables for the circuit configuration. One or more conventional desktop computer systems can be used to provide the front end and back end processing necessary to provide the processing for the logic synthesis system. Those skilled in the art will be able to construct a suitable logic synthesis system to provide the functionality and operations described herein. An example of a suitable computer is illustrated in FIG. 26 and is described below.

Figure 26:
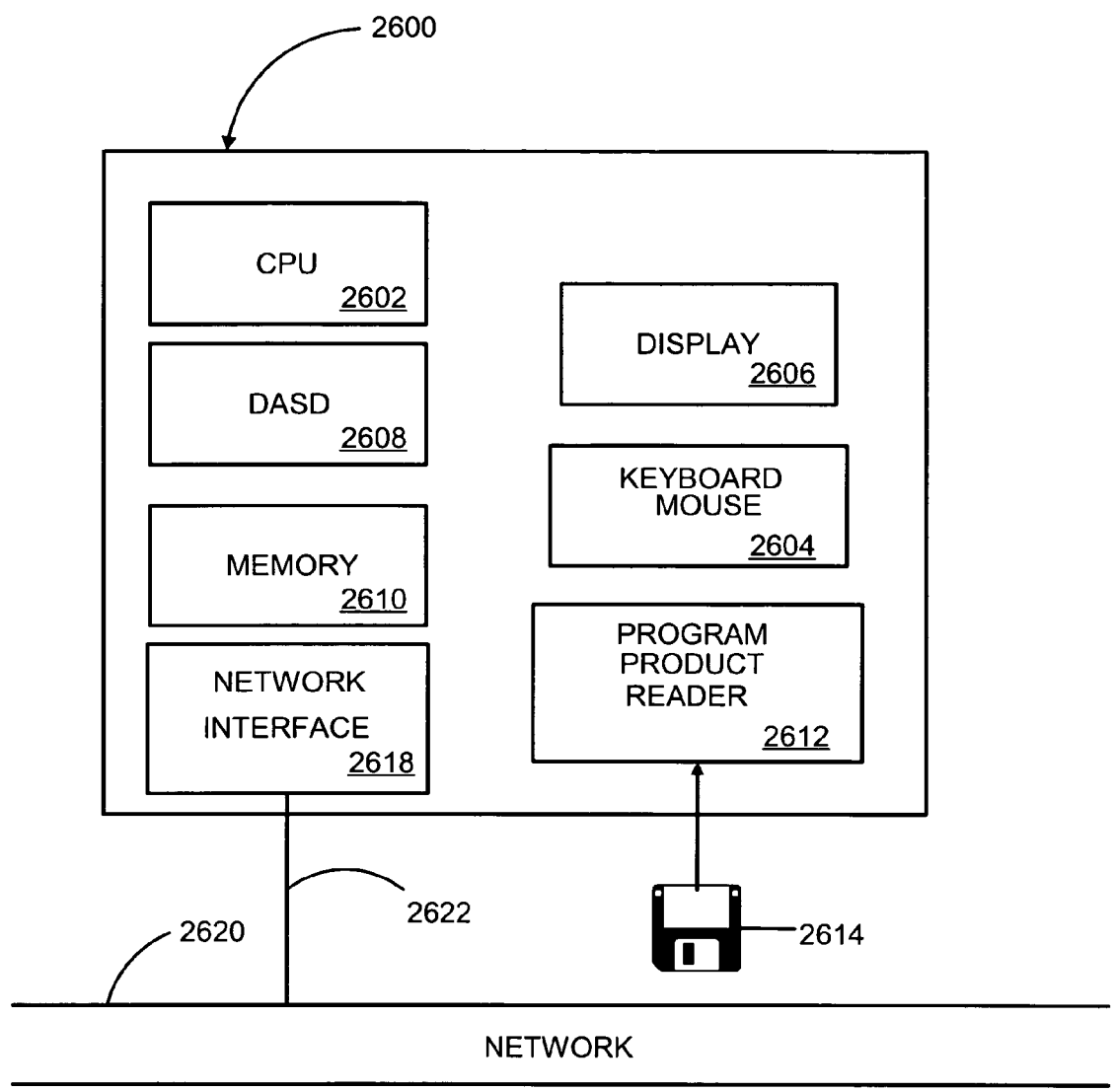
FIG. 26 is a block diagram of a computer system that implements the circuit synthesis of the invention.

FIG. 26 shows an exemplary computer 2600 such as might comprise a computer system for executing the logic synthesis operations described above. The computer 2600 can be a stand-alone computer or can be operated in a networked environment that permits communication with other computers. The computer 2600 operates under control of a central processor unit (CPU) 2602, such as a "Pentium" microprocessor and associated integrated circuit chips, available from Intel Corporation of Santa Clara, Calif., USA. A computer user can input commands and data from a keyboard and computer mouse 2604, and can view inputs and computer output at a display 2606. The display is typically a video monitor or flat panel display. The computer 2600 also typically includes a direct access storage device (DASD) 2608, such as a hard disk drive. A memory 2610 typically comprises volatile semiconductor random access memory (RAM). Each computer preferably includes a program product reader 2612 that accepts a program product storage device 2614, from which the program product reader can read data (and to which it can optionally write data). The program product reader can comprise, for example, a disk drive, and the program product storage device can comprise removable storage media such as a magnetic floppy disk, a CD-R disc, a CD-RW disc, or DVD disc.

The computer 2600 can communicate with any other computers, if networked, over a computer network 2620 (such as the Internet or an intranet) through a network interface 2618 that enables communication over a connection 2622 between the network 2620 and the computer. The network interface 2618 typically comprises, for example, a Network Interface Card (NIC) or a modem that permits communications over a variety of networks.

The CPU 2602 operates under control of programming instructions that are temporarily stored in the memory 2610 of the computer 2600. When the programming instructions are executed, the computer performs its functions. Thus, the programming steps implement the functionality of the logic synthesis system described above. The programming steps can be received from the DASD 2608, through the program product storage device 2614, or through the network connection 2622. The program product storage drive 2612 can receive a program product 2614, read programming steps recorded thereon, and transfer the programming steps into the memory 2610 for execution by the CPU 2602. As noted above, the program product storage device can comprise any one of multiple removable media having recorded computer-readable instructions, including magnetic floppy disks and CD-ROM storage discs. Other suitable program product storage devices can include magnetic tape and semiconductor memory chips. In this way, the processing steps necessary for operation in accordance with the invention can be embodied on a program product.

Alternatively, the program steps can be received into the operating memory 2610 over the network 2620. In the network method, the computer receives data including program steps into the memory 2610 through the network interface 2618 after network communication has been established over the network connection 2622 by well-known methods that will be understood by those skilled in the art without further explanation. The program steps are then executed by the CPU 2602 thereby comprising a computer process.

Thus, the invention provides a new way of synthesizing multi-level combinational circuits with cyclic topologies. The techniques, applicable in logic synthesis, and in particular in the structuring phase of logic synthesis, optimize a multi-level description, introducing feedback and potentially optimizing the network.

The foregoing description details certain embodiments of the invention. It will be appreciated, however, that no matter how detailed the foregoing appears, the invention may be embodied in other specific forms without departing from its spirit or essential characteristics. The described embodiments are to be considered in all respects only as illustrative and not restrictive and the scope of the invention is, therefore, indicated by the appended claims rather than by the foregoing description. All changes which come with the meaning and range of equivalency of the claims are to be embraced within their scope.

The invention claimed is:

1. A method of producing a cyclic combinational circuit, the method comprising:
   determining cyclic parameters; and
   synthesizing the cyclic combinational circuit in accordance with the determined cyclic parameters;
   wherein the synthesizing comprises creating a network with no cycles, introducing cycles into the network, and determining if the network is combinational, and repeating introducing cycles into the network until a desired cyclic combinational circuit is implemented.

2. The method as defined in claim 1, wherein the determining cyclic parameters further comprises:
   defining at least one input variable;
   defining at least one output variable; and
   defining a relationship between the at least one input and the at least one output variable whereby the relationship includes a cycle.

3. The method as defined in claim 2, further including at least one internal variable.

4. The method as defined in claim 2, wherein the relationship includes structured dependency between an input variable and an output variable.

5. The method as defined in claim 1, wherein the determining cyclic parameters further comprises:
   defining at least one input variable;
   defining at least one internal variable; and
   defining a relationship between the at least one input and the at least one internal variable whereby the relationship includes a cycle.

6. The method as defined in claim 5, wherein the at least one internal variable is an output variable.

7. The method as defined in claim 5, wherein the relationship includes structured dependency between an input variable and an internal variable.

8. The method as defined in claim 1, wherein the determined cyclic parameters are used in a logic synthesis process.

9. The method as defined in claim 8, wherein the determined cyclic parameters are used in a structuring operation of the logic synthesis process.

10. The method as defined in claim 9, wherein the structuring operation includes a substitution phase of the logic synthesis process.

11. The method as defined in claim 1, wherein the method of producing a cyclic combinational circuit is optimized.

12. The method as defined in claim 11, wherein the cyclic combinational circuit is optimized with regard to cost.

13. The method as defined in claim 12, wherein the cost is measured as an area.

14. The method as defined in claim 13, wherein the area is determined by a literal count.

15. The method as defined in claim 13, wherein the area is determined by a gate count.

16. The method as defined in claim 11, wherein the cyclic combinational circuit is optimized with regard to performance.

17. The method as defined in claim 16, wherein the performance is measured as a delay of the combinational circuit.

18. The method as defined in claim 11, wherein the cyclic combinational circuit is optimized with regard to power consumption.

19. The method as defined in claim 11, wherein the cyclic combinational circuit is optimized with regard to testability.

20. The method as defined in claim 1, wherein the cyclic combinational circuit is optimized.

21. The method as defined in claim 20, wherein the cyclic combinational circuit is optimized with regard to cost.

22. The method as defined in claim 21, wherein the cost is measured as an area.

23. The method as defined in claim 22, wherein the area is determined by a literal count.

24. The method as defined in claim 22, wherein the area is determined by a gate count.

25. The method as defined in claim 20, wherein the cyclic combinational circuit is optimized with regard to performance.

26. The method as defined in claim 25, wherein the performance is measured as a delay of the cyclic combinational circuit.

27. The method as defined in claim 20, wherein the cyclic combinational circuit is optimized with regard to fault tolerance.

28. The method as defined in claim 20, wherein the cyclic combinational circuit is optimized with regard to power consumption.

29. The method as defined in claim 20, wherein the cyclic combinational circuit is optimized with regard to testability.

30. The method as defined in claim 1, wherein the introducing, the determining and the repeating are performed in a structuring operation of logic synthesis.

31. The method as defined in claim 30, wherein the structuring operation includes a substitution phase of logic synthesis.

32. A method of producing a cyclic combinational circuit, the method comprising:
determining cyclic parameters; and
synthesizing the cyclic combinational circuit in accordance with the determined cyclic parameters;
wherein the method of producing a cyclic combinational circuit is optimized, and
wherein the cyclic combinational circuit is optimized with regard to fault tolerance.

33. A method of producing a cyclic combinational circuit, the method comprising:
determining cyclic parameters; and
synthesizing the cyclic combinational circuit in accordance with the determined cyclic parameters;
wherein the synthesizing comprises:
creating a densely interconnected network;
excluding edges from the densely interconnected network;
determining if the densely interconnected network is combinational; and
repeating the excluding edges from the densely interconnected network until a desired cyclic combinational circuit is implemented.

34. The method as defined in claim 33 wherein the desired cyclic combinational circuit is optimized.

35. The method as defined in claim 34, wherein the desired cyclic combinational circuit is optimized with regard to cost.

36. The method as defined in claim 35, wherein the cost is measured as an area.

37. The method as defined in claim 36, wherein the area is determined by a literal count.

38. The method as defined in claim 36, wherein the area is determined by a gate count.

39. The method as defined in claim 34, wherein the desired cyclic combinational circuit is optimized with regard to performance.

40. The method as defined in claim 39, wherein the performance is measured as a delay of the combinational circuit.

41. The method as defined in claim 34, wherein the desired cyclic combinational circuit is optimized with regard to fault tolerance.

42. The method as defined in claim 34, wherein the desired cyclic combinational circuit is optimized with regard to power consumption.

43. The method as defined in claim 34, wherein the desired cyclic combinational circuit is optimized with regard to testability.

44. The method as defined in claim 33, wherein the introducing, the determining and the repeating is performed in a structuring operation of logic synthesis.

45. The method as defined in claim 44, wherein the structuring operation includes a substitution phase of logic synthesis.

46. A method of logic synthesis, the method comprising:
determining cyclic parameters; and
using the determined cyclic parameters during synthesis of a cyclic combinational circuit;
wherein synthesis comprises creating a network with no cycles, introducing cycles into the network, and determining if the network is combinational, and repeating introducing cycles into the network until a desired cyclic combinational circuit is implemented.

47. The method as defined in claim 46, wherein the determined cyclic parameters are used in a structuring operation of logic synthesis.

48. The method as defined in claim 47, wherein the structuring operation includes a substitution phase of the logic synthesis.

49. A logic synthesizer comprising:
a logic for determining a set of cyclic parameters; and a processor configured to synthesize a cyclic combinational circuit in accordance with the determined set of cyclic parameters;

wherein the processor creates a network with no cycles, and then introduces cycles into the network and determines if the network is combinational, and then it repeats introducing cycles into the network until a desired cyclic combinational circuit is implemented.

50. The logic synthesizer as defined in claim 49, wherein the determined set of cyclic parameters further comprises:
at least one input variable;
at least one output variable; and
a relationship between the at least one input variable and at least one output variable whereby the relationship includes a cycle.

51. The logic synthesizer as defined in claim 50, further including at least one internal variable.

52. The logic synthesizer as defined in claim 50, wherein the relationship includes structured dependency between an input variable and an output variable.

53. The logic synthesizer as defined in claim 49, wherein the determined set of cyclic parameters further comprises:
at least one input variable;
at least one internal variable; and
a relationship between the at least one input variable and the at least one internal variable whereby the relationship includes a cycle.

54. The logic synthesizer as defined in claim 53, wherein the at least one internal variable is an output variable.

55. The logic synthesizer as defined in claim 53, wherein the relationship includes structured dependency between an input variable and an internal variable.

56. The logic method as defined in claim 49, wherein the determined set of cyclic parameters are used in a logic synthesis process.

57. The logic synthesizer as defined in claim 56, wherein the determined set of cyclic parameters are used in a structuring operation of the logic synthesis process.

58. The logic synthesizer as defined in claim 57, wherein the structuring operation includes a substitution phase of the logic synthesis process.

59. The logic synthesizer as defined in claim 49, wherein the synthesized cyclic combinational circuit is optimized.

60. The logic synthesizer as defined in claim 59, wherein the cyclic combinational circuit is optimized with regard to cost.

61. The logic synthesizer as defined in claim 60, wherein the cost is measured as an area.

62. The logic synthesizer as defined in claim 61, wherein the area is determined by a literal count.

63. The logic synthesizer as defined in claim 61, wherein the area is determined by a gate count.

64. The logic synthesizer as defined in claim 59, wherein the cyclic combinational circuit is optimized with regard to performance.

65. The logic synthesizer as defined in claim 64, wherein the performance is measured as a delay of the cyclic combinational circuit.

66. A logic synthesizer comprising:
a logic for determining a set of cyclic parameters; and
a processor configured to synthesize a cyclic combinational circuit in accordance with the determined set of cyclic parameters;
wherein the synthesized cyclic combinational circuit is optimized; and
wherein the cyclic combinational circuit is optimized with regard to fault tolerance.

67. The logic synthesizer as defined in claim 59, wherein the cyclic combinational circuit is optimized with regard to power consumption.

68. The logic synthesizer as defined in claim 59, wherein the cyclic combinational circuit is optimized with regard to testability.

69. A logic synthesizer comprising:
a logic for determining a set of cyclic parameters; and
a processor configured to synthesize a cyclic combinational circuit in accordance with the determined set of cyclic parameters;
wherein the processor creates a densely interconnected network, and then excludes edges from the densely interconnected network and determines if the densely interconnected network is combinational, and then repeats excluding edges from the densely interconnected network until a desired cyclic combinational circuit is implemented.

* * * * *

UNITED STATES PATENT AND TRADEMARK OFFICE
CERTIFICATE OF CORRECTION

| | | |
|---|---|---|
| PATENT NO. | : 7,249,341 B2 | Page 1 of 1 |
| APPLICATION NO. | : 10/728570 | |
| DATED | : July 24, 2007 | |
| INVENTOR(S) | : Marcus D. Riedel et al. | |

It is certified that error appears in the above-identified patent and that said Letters Patent is hereby corrected as shown below:

Please insert in column 1 at line 17 after the title of invention, the following:

--STATEMENT AS TO RIGHTS TO INVENTIONS MADE UNDER FEDERALLY SPONSORED RESEARCH OR DEVELOPMENT

The U.S. Government has certain rights in this invention pursuant to Grant No. NPO 30905 awarded by the NASA and Grant No. N00014-97-1-0293 awarded by the Office of Naval Research.--

Signed and Sealed this

Tenth Day of June, 2008

JON W. DUDAS
*Director of the United States Patent and Trademark Office*